(12) United States Patent
Kim et al.

(10) Patent No.: US 9,590,023 B2
(45) Date of Patent: Mar. 7, 2017

(54) ORGANIC LIGHT-EMITTING DISPLAY APPARATUS AND METHOD OF REPAIRING THE SAME

(71) Applicant: SAMSUNG DISPLAY CO., LTD., Yongin, Gyeonggi-Do (KR)

(72) Inventors: Jin-Woo Kim, Yongin (KR); Myeong-Bin Lim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 37 days.

(21) Appl. No.: 14/598,200

(22) Filed: Jan. 15, 2015

(65) Prior Publication Data

US 2015/0364531 A1 Dec. 17, 2015

(30) Foreign Application Priority Data

Jun. 11, 2014 (KR) .................. 10-2014-0071071

(51) Int. Cl.
*H01L 27/32* (2006.01)
*G09G 3/32* (2016.01)
*H01L 51/56* (2006.01)

(52) U.S. Cl.
CPC ....... *H01L 27/3276* (2013.01); *G09G 3/3233* (2013.01); *H01L 51/56* (2013.01);
(Continued)

(58) Field of Classification Search
CPC ...................................................... H01L 27/32
See application file for complete search history.

(56) References Cited

U.S. PATENT DOCUMENTS

2004/0066146 A1 4/2004 Park et al.
2006/0077313 A1 4/2006 Liu et al.
(Continued)

FOREIGN PATENT DOCUMENTS

KR          10-0666639 B1    1/2007
KR     10-2007-0048525 A    5/2007
(Continued)

OTHER PUBLICATIONS

EPO Search Report dated Jul. 2, 2015, for corresponding European Patent application 15163648.7, (9 pages).

*Primary Examiner* — John P Dulka
*Assistant Examiner* — Christina Sylvia
(74) *Attorney, Agent, or Firm* — Lewis Roca Rothgerber Christie LLP

(57) ABSTRACT

An organic light-emitting display apparatus includes: a plurality of dummy pixels including a dummy pixel circuit; a plurality of pixels including a first pixel including: a light-emitting element configured to emit light in response to a driving current supplied from the dummy pixel circuit; and a pixel circuit separated from the light-emitting element; a plurality of voltage lines configured to apply a power voltage to a power node of a second pixel; and a plurality of repair lines including: a first repair line coupling the dummy pixel circuit and the light-emitting element and configured to transfer to the light-emitting element the driving current supplied from the dummy pixel circuit; and a second repair line coupling the dummy pixel circuit and the power node of the second pixel and configured to apply to the dummy pixel circuit the power voltage that is applied to the power node.

21 Claims, 12 Drawing Sheets

(52) U.S. Cl.
CPC ............... *G09G 2300/0413* (2013.01); *G09G 2300/0842* (2013.01); *G09G 2330/08* (2013.01); *G09G 2330/10* (2013.01); *H01L 2251/568* (2013.01)

(56) References Cited

U.S. PATENT DOCUMENTS

2007/0152567 A1* 7/2007 Yao ...................... G09G 3/3233
313/504
2013/0176194 A1 7/2013 Jin et al.

FOREIGN PATENT DOCUMENTS

| KR | 1020130035459 A2 * | 4/2013 | ............. H01L 51/50 |
| KR | 20130059847 A * | 6/2013 | |
| KR | 1020130159645 A2 * | 12/2013 | ............. H01L 27/32 |
| KR | 10-2015-0072225 | 6/2015 | |

* cited by examiner

ORGANIC LIGHT-EMITTING DISPLAY APPARATUS AND METHOD OF REPAIRING THE SAME

CROSS-REFERENCE TO RELATED APPLICATION

This application claims priority to and the benefit of Korean Patent Application No. 10-2014-0071071, filed on Jun. 11, 2014, in the Korean Intellectual Property Office, the disclosure of which is incorporated herein in its entirety by reference.

BACKGROUND

1. Field

One or more embodiments of the present invention relate to an organic light-emitting display apparatus and a method of repairing the same.

2. Description of the Related Art

In display devices, when a defect occurs in a specific pixel, the specific pixel may emit light all the time or may not emit light at all irrespective of a scan signal and a data signal applied thereto. As such, the defective pixel is perceived by a viewer as either a bright spot or a dark spot. Bright spots due to defective pixels may have particularly high visibility and thus may be easily observed or perceived by viewers. Accordingly, in the related art, the visibility of a defective pixel is reduced by using a dummy pixel to repair the defective pixel perceived as a bright spot to be perceived as a dark spot.

SUMMARY

One or more embodiments of the present invention include an organic light-emitting display apparatus that may be repaired by using a dummy pixel to replace a defective pixel, and a method of repairing the organic light-emitting display apparatus.

According to some embodiments of the present invention, an organic light-emitting display apparatus includes: a plurality of dummy pixels including a dummy pixel circuit; a plurality of pixels including a first pixel including: a light-emitting element configured to emit light in response to a driving current supplied from the dummy pixel circuit; and a pixel circuit separated from the light-emitting element; a plurality of voltage lines configured to apply a power voltage to a power node of a second pixel; and a plurality of repair lines including: a first repair line coupling the dummy pixel circuit and the light-emitting element and configured to transfer to the light-emitting element the driving current supplied from the dummy pixel circuit; and a second repair line coupling the dummy pixel circuit and the power node of the second pixel and configured to apply to the dummy pixel circuit the power voltage that is applied to the power node.

The second pixel may be adjacent the first pixel.

The plurality of pixels including the first pixel and the second pixel may be arranged in a row direction and a column direction, at least one of the repair lines and at least one of the dummy pixels may be arranged in each column, the second pixel may be located in a first pixel column and the first pixel is located in a second pixel column different from the first pixel column, the first repair line may correspond to the first pixel column, and the second repair line may correspond to the second pixel column, and the dummy pixel configured to supply the driving current to the light-emitting element may correspond to the first pixel column or the second pixel column.

The organic light-emitting display apparatus may further include an auxiliary repair line electrically coupling the dummy pixel circuit and the second repair line.

The auxiliary repair line may couple at least two repair lines from among the plurality of repair lines.

The auxiliary repair line may couple the first repair line and the second repair line, the first repair line may include a first portion coupling the auxiliary repair line and the dummy pixel circuit and a second portion coupling the dummy pixel circuit and the light-emitting element, and the first portion and the second portion may be electrically isolated from each other.

The auxiliary repair line may include a first node coupled to the first repair line and a second node coupled to the second repair line, and both outer edges of a portion of the auxiliary repair line between the first node and the second node may be cut.

The second pixel may include a second pixel circuit and a second light-emitting element configured to emit light in response to a driving current supplied from the second pixel circuit.

According to some embodiments of the present invention, in a method of repairing an organic light-emitting display apparatus, the organic light-emitting display apparatus including: a plurality of dummy pixels each including a dummy pixel circuit; a plurality of pixels each including a light-emitting element and a pixel circuit; and a plurality of repair lines each coupling at least one of the plurality of pixels and at least one of the plurality of dummy pixels, the method includes: electrically isolating the light-emitting element and the pixel circuit in a first pixel in which a defect occurs; electrically coupling the light-emitting element and the dummy pixel circuit of the first pixel to a first repair line to supply a driving current from the dummy pixel circuit to the light-emitting element of the first pixel; and electrically coupling a power node of a pixel circuit of a second pixel and the dummy pixel circuit to a second repair line to apply a power voltage of the second pixel to the dummy pixel circuit.

The plurality of pixels may be arranged in row directions and column directions, at least one of the repair lines and at least one of the dummy pixels may be arranged in each column, and the first repair line and the second repair line may be arranged in different columns.

The electrical coupling of the power node may include: coupling the power node of the pixel circuit of the second pixel to the second repair line; coupling an output node of a pixel circuit of the dummy pixel circuit to the first repair line; coupling the first repair line and the second repair line by using an auxiliary repair line; and electrically isolating a portion between a first point of the first repair line to which the output node of the pixel circuit of the dummy pixel circuit is coupled and a second point of the first repair line to which a power node of the dummy pixel circuit is coupled.

The auxiliary repair line may include a first node coupled to the first repair line and a second node coupled to the second repair line, and the method may further include cutting both outer edges of a portion between the first node and the second node.

The electrical coupling of the light-emitting element may include coupling the light-emitting element of the first pixel and the first repair line in an overlapping region between the light-emitting element of the first pixel and the first repair line, and coupling the dummy pixel circuit and the first repair line in an overlapping region between the dummy pixel circuit and the first repair line, and the electrical coupling of the power node may include coupling the power node of the pixel circuit of the second pixel and the second repair line in an overlapping region between the power node of the pixel circuit of the second pixel and the second repair line and coupling the dummy pixel circuit and the second repair line in an overlapping region between the dummy pixel circuit and the second repair line.

The electrical coupling of the light-emitting element may include causing a first insulating portion between the light-emitting element of the first pixel and the first repair line and a second insulating portion between the dummy pixel circuit and the first repair line to break down, and the electrical coupling of the power node may include causing a third insulating portion between the power node of the pixel circuit of the second pixel and the second repair line and a fourth insulating portion between the dummy pixel circuit and the second repair line to break down.

According to some embodiments of the present invention, an organic light-emitting display apparatus includes: a plurality of dummy pixels, each of the dummy pixels including a dummy pixel circuit; a plurality of pixels, each of the plurality of pixels including a light-emitting element and a pixel circuit; and a plurality of repair lines, each configured to couple a corresponding one of the dummy pixels and a corresponding one of the pixels, wherein each pixel includes a first connection portion that enables one electrode of the light-emitting element to be connectable to the repair line and a second connection portion that enables a power node of the pixel circuit to be connectable to the repair line.

The dummy pixel may include a third connection portion that enables an output node of the dummy pixel circuit to be connectable to the repair line and a fourth connection portion that enables a power node of the dummy pixel circuit to be connectable to the repair line.

The plurality of the pixels may be arranged in a row direction and a column direction, each of a plurality of the repair lines and a plurality of the dummy pixels may be arranged in one column or one row, and each of the plurality of dummy pixels may include a third connection portion that enables an output node of the dummy pixel circuit to be connectable to at least one selected from the plurality of repair lines and a fourth connection portion that enables a power node of the dummy pixel circuit to be connectable to at least one selected from the plurality of repair lines.

At least one selected from the third connection portion and the fourth connection portion may be configured to be connectable to at least one selected from a first repair line that is provided to correspond to a column of the dummy pixel and a second repair line that is arranged to correspond to a column adjacent to the column of the dummy pixel.

The first connection portion may include an overlapping region between one electrode of the light-emitting element and the repair line with a first insulating portion therebetween and an overlapping region between the power node of the pixel circuit and the repair line with a second insulating portion therebetween.

The organic light-emitting display apparatus may further include an auxiliary repair line coupling at least two repair lines from among a plurality of the repair lines.

Each of the repair lines may be arranged in each pixel column or each pixel row, the plurality of the pixels may include a first pixel and a second pixel, and the plurality of repair lines may include a first repair line that is arranged in a first pixel column including the first pixel and a second repair line that is arranged in a second pixel column including the second pixel, and the first pixel may include a first connection portion that enables one electrode of the light-emitting element to be connectable to at least one of the first repair line and second repair line, and a second connection portion that enables a power node of the pixel circuit to be connectable to at least one of the first repair line and the second repair line.

Additional aspects will be set forth in part in the description which follows and, in part, will be apparent from the description, or may be learned by practice of the presented embodiments.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
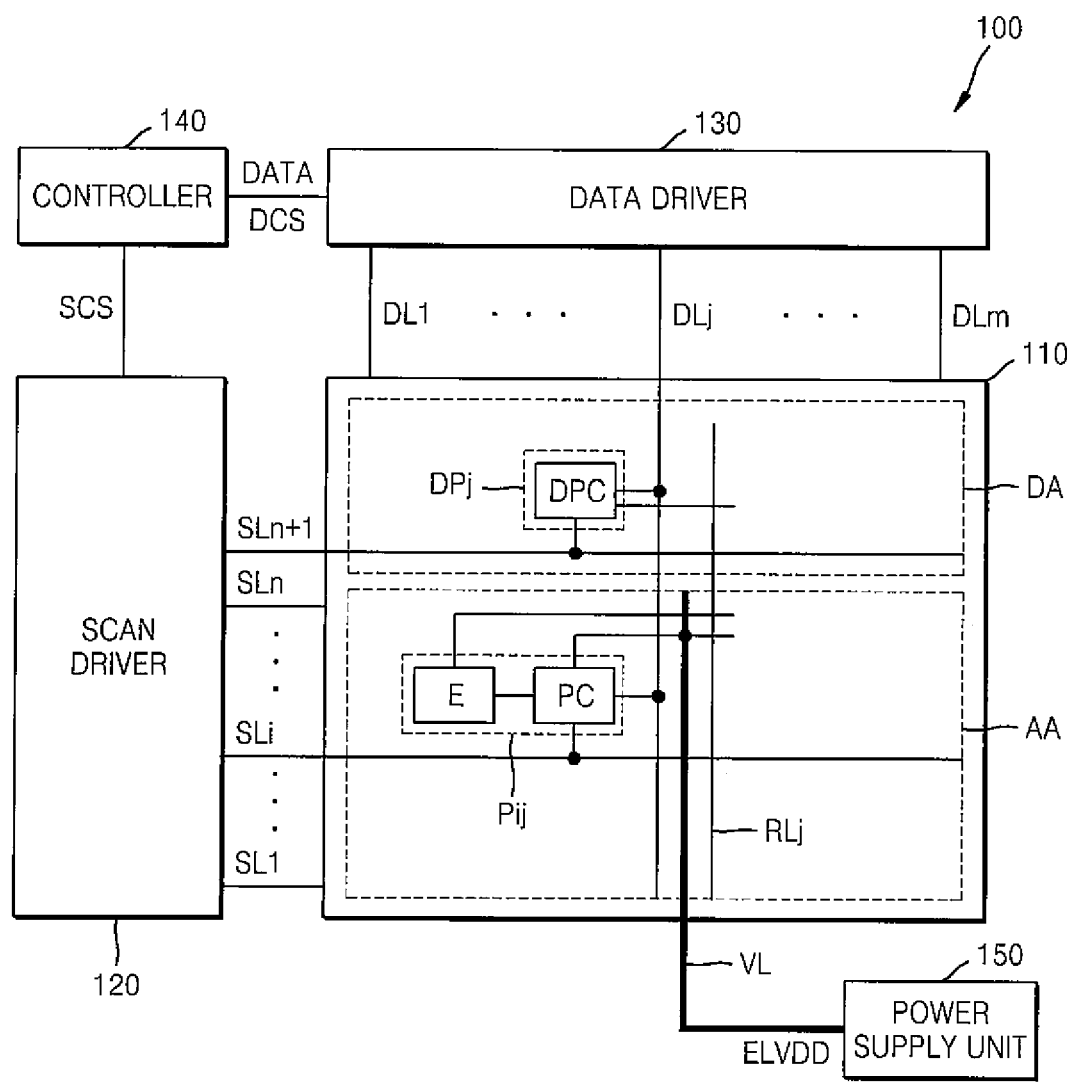
FIG. 1 is a block diagram illustrating an organic light-emitting display apparatus, according to an embodiment of the present invention.

The present invention may include various embodiments and modifications, and example embodiments thereof will be illustrated in the drawings and will be described herein in more detail. Aspects and features of the present invention and the accompanying methods thereof will become apparent from the following description of the embodiments, taken in conjunction with the accompanying drawings. However, the present invention is not limited to the embodiments described below, and may be embodied in various ways.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the present invention is not limited thereto.

When a certain embodiment may be implemented differently, a specific process order may be performed differently from the described order. For example, two consecutively described processes may be performed substantially at the same time or performed in an order opposite to the described order.

Aspects of embodiments of the present invention will now be described more fully with reference to the accompanying drawings, in which example embodiments of the present invention are shown. In the drawings, the same elements are denoted by the same reference numerals and a repeated explanation thereof will not be given.

FIG. 1 is a block diagram illustrating an organic light-emitting display apparatus 100 according to an embodiment of the present invention.

Referring to FIG. 1, the organic light-emitting display apparatus 100 may include a display panel 110, a scan driver 120, a data driver 130, a controller 140, and a power supply unit 150. The scan driver 120, the data driver 130, and the controller 140 may be respectively formed on individual semiconductor chips, or may be integrated into one semiconductor chip. The scan driver 120 and the display panel 110 may be formed on the same substrate.

An active area AA where pixels P are arranged and a dummy area DA where dummy pixels DP are arranged may be defined or located on the display panel 110. The dummy area DA may be located outside the active area AA to be adjacent to the active area AA. For example, the dummy area DA may be located over (e.g., from a plan view) the active area AA as shown in FIG. 1, or may be located under (e.g., from a plan view) the active area AA. Alternatively, the dummy area DA may be located both over and under the active area AA. Alternatively, the dummy area DA may be located at the left and/or the right of the active area AA. The display panel 110 may be, but is not limited to, a flat display panel such as an organic light-emitting diode (OLED) panel, a thin-film transistor-liquid crystal display (TFT-LCD) panel, a plasma display panel (PDP), or a light-emitting diode (LED) panel. The following will be explained on the assumption that the display panel 110 is an OLED panel.

The pixels P including a pixel Pij that is coupled to an ith scan line SLi and a jth data line DLj are arranged in the active area AA. The pixels P and the dummy pixels DP are coupled to scan lines SL1-SLn+1 (hereinafter, referred to as 'SL') that extend in a row direction and data lines DL1-DLm (hereinafter, referred to as 'DL') that extend in a column direction. The pixels P are arranged in the row direction and the column direction, for example, in a matrix form. The term 'row direction' used herein refers to a horizontal direction in FIG. 1 and the term 'column direction' used herein refers to a vertical direction in FIG. 1. However, the row direction and the column direction may respectively refer to a vertical direction and a horizontal direction. In particular, in the organic light-emitting display apparatus 100 or an application product including the organic light-emitting display apparatus 100, the row direction may be a vertical direction and the column direction may be a horizontal direction. The row direction and the column direction may be or may not be perpendicular to each other.

Each of the scan lines SL is coupled to the pixels P of the same row or the dummy pixels DP of the same row, and transfers a scan signal to the pixels P of the same row or the dummy pixels DP of the same row. Each of the data lines DL is connected to the pixels P of the same column and the dummy pixels DP of the same column, and transfers a data signal to the pixels P of the same column and the dummy pixels DP of the same column.

The display panel 110 includes a voltage line VL that is coupled to the pixels P to apply a power voltage (e.g., ELVDD) to the pixels P. The voltage line VL is coupled to the power supply unit 150. The power supply unit 150 generates the power voltage ELVDD for driving the pixels P and applies the power voltage ELVDD to the voltage line VL. Although the power voltage ELVDD is a positive voltage in FIG. 1, the power supply unit 150 may apply a negative voltage (e.g., ELVSS) or a ground voltage to the voltage line VL according to a circuit configuration of the pixels P.

Only a portion of the voltage line VL is illustrated in FIG. 1. Although the voltage line VL extends in the column direction in FIG. 1, the voltage line VL may extend in the row direction or may have a grid structure that extends in both the row direction and the column direction. Although embodiments of the present invention will be explained on the assumption that the voltage line VL extends in the column direction, the embodiments of the present invention may apply to any of various cases, for example, the case where the voltage line VL extends in the row direction or the case where the voltage line VL extends in both the row direction and the column direction.

Because driving power for driving the pixels P and causing the pixels P to emit light is supplied through the voltage line VL, the amount of current flowing through the voltage line VL is relatively large. The voltage line VL has a line resistance, and a voltage drop occurs due to the current flowing through the voltage line VL. The voltage drop is referred to as an IR-drop. In order to reduce the amount of the IR-drop, the voltage line VL may be designed to have a low line resistance. For example, the voltage line VL may have a greater width than other lines (for example, the data lines DL, the scan lines SL, and repair lines RL). For example, a width of the voltage line VL may be several times greater than a width of one of the data lines DL, the scan lines SL, and the repair lines RL. Also, the voltage line VL may have a greater thickness than other lines.

Due to the IR-drop, a level of the power voltage ELVDD may vary according to a position on the voltage line VL. For example, a level of the power voltage ELVDD of a portion of the voltage line VL that is directly coupled to the power supply unit 150 is higher than a level of the ELVDD of a portion of the voltage line VL that is far from the power supply unit 150. When the power supply unit 150 is located outside the display panel 110, a level of the power voltage ELVDD may be reduced from an outer edge of the display panel 110 toward a central portion of the display panel 110. A luminance of the pixels P at a position where a level of the power voltage ELVDD is high may be higher than a luminance of the pixels P at a position where a level of the power voltage ELVDD is low.

However, because the pixels P are commonly coupled to the voltage line VL and thus levels of the power voltage ELVDD applied to adjacent pixels P may be substantially the same or similar, a luminance difference between the adjacent pixels P may not be great and the luminance difference may not be perceived by a viewer.

When a defective pixel is repaired by using a dummy pixel DP, the dummy pixel DP and the pixel P that is adjacent to the defective pixel may not be adjacent to each other. In this case, there may be a great difference between a level of the power voltage ELVDD applied to the pixel P that is adjacent to the defective pixel and a level of the power voltage ELVDD applied to the dummy pixel DP. In this case, there may be a luminance difference between the pixel P that is adjacent to the defective pixel and the defective pixel that is repaired by using the dummy pixel DP, and the luminance difference may be perceived by the viewer. Thus, an image with reduced quality may be seen by the viewer.

In FIG. 1, in order to avoid (or reduce) image quality degradation due to such a luminance difference, the power voltage ELVDD that is applied to the dummy pixel DP that is used to repair the defective pixel may not be directly applied from the voltage line VL and may be applied through a repair line RL. For example, the power voltage ELVDD that is applied to the defective pixel or a neighboring pixel of the defective pixel may be applied through the repair line RL to the dummy pixel DP that is used to repair the defective pixel. Accordingly, a luminance difference between the defective pixel that is repaired by using the dummy pixel DP and the pixel P that is adjacent to the defective pixel may be reduced, which will be explained below in more detail.

The display panel 110 includes the plurality of repair lines RL including a repair line RLj of FIG. 1. Each of the repair lines RL is connectable to the pixels P of the same column, and extends in the column direction to be connectable (e.g., configured to be coupled) to the dummy pixels DP of the same column. Referring to FIG. 1, the repair line RLj is transferably arranged to transfer driving current to one (for example, the pixel Pij) selected from among the pixels P of the same column from the dummy pixel DPj of the same column. When the repair line RLj is coupled to the pixel Pij of the same column and the dummy pixel DPj of the same column, the dummy pixel DPj may apply a driving current to the pixel Pij through the repair line RLj. Referring to FIG. 1, the repair line RLj is transferably arranged to transfer driving power, e.g., the power voltage ELVDD, which is supplied to the pixel Pij, from a power node that receives the driving power of the pixel Pij to the dummy pixel DPj of the same column or a dummy pixel of a different column. When the repair line RLj is connected to a dummy pixel of the same column or different column as or from the pixel Pij, the driving power that is supplied to the pixel Pij may be supplied through the repair line RLj to the dummy pixel coupled to the repair line RLj.

The terms "connectable" and "configured to be coupled" used herein refer to a state or configuration where a line is not currently electrically coupled but may be electrically coupled during a repair process. For example, when a first member and a second member are arranged to be connectable, although the first member and the second member are not currently coupled to each other, the first member and the second member may be coupled to each other during a repair process.

Structurally, the "connectable" first and second members may be arranged to intersect each other with an insulating film therebetween in an overlap region. When a laser beam is emitted to the overlap region during a repair process, the insulating film in the overlap region may break down and the first member and the second member may be electrically coupled to each other. A method of causing the insulating film to break down is not limited to the emission of the laser beam.

The term "transferrable" or "transferably" used herein refers to a case where when two connectable elements are coupled to each other during a repair process, and a current or voltage transfer may occur between the two elements. That is, although no transfer occurs between the two elements before the two elements are coupled to each other during a repair process, once the two elements are coupled to each other during the repair process, a transfer may occur between the two elements.

The expression "separable" or "separably" used herein refers to a case where elements may be separated by using a laser beam during a repair process. For example, when a first member and a second member are separably coupled to each other, although the first member and the second member are currently coupled to each other, the first member and the second member may be separated or isolated from each other during a repair process.

Structurally, a first member and a second member that are separably coupled to each other may be arranged to be connectable to each other through a conductive connection member. When a laser beam is emitted to the conductive connection member during a repair process, a portion of the conductive connection member where the laser beam is emitted melts and is cut. Thus, the first member and the second member are electrically insulated from each other. For example, the conductive connection member may include a silicon layer that may melt due to heat generated by a laser beam. In this case, the conductive connection member that separably connects the first member and the second member may include a portion where a laser beam may be emitted. Alternatively, the conductive connection member may melt and be cut due to Joule heat caused by a current. A method of cutting the conductive connection member is not limited to the emission of the laser beam.

The dummy pixels DP including the dummy pixel DPj are arranged in the dummy area DA. As shown in FIG. 1, the dummy pixels DP may be arranged in the row direction.

Alternatively, the dummy pixels DP may be arranged in two or more rows. Alternatively, the dummy pixels DP may be arranged in two or more rows over and under the active area AA. Alternatively, the dummy area DA may be formed at the left and/or the right of the active area AA, and the dummy pixels DP may be arranged in the column direction.

The dummy pixels DP may be respectively coupled to the data lines DL of the same column. The dummy pixels DP may be coupled to the repair line RL of the same column. When the dummy pixels DP are arranged in two or more rows or the dummy pixels DP include two or more dummy pixel circuits DPC, the repair line RL may be arranged to be coupled to one of the dummy pixels DP of the same column or may be arranged to be coupled to one of the dummy pixel circuits DPC of the dummy pixel DP of the same column.

The scan line SLn+1 for the dummy pixels DP is arranged in the dummy area DA in FIG. 1, and in this case, a scan signal for the dummy pixels DP may be applied through the scan line SLn+1 to the dummy pixels DP. However, the present embodiment is not limited thereto, and additional scan lines for the dummy pixels DP may be further arranged in the dummy area DA, or any scan line may be omitted and thus may not be coupled to the scan driver 120.

Each of the pixels P includes a light-emitting element E and a pixel circuit PC that are separably coupled to each other. Although one pixel P includes one light-emitting element E and one pixel circuit PC in FIG. 1, the present embodiment is not limited thereto and one pixel P may include a plurality of the light-emitting elements E and a plurality of the pixel circuits PC. In this case, a light-emitting element E and a pixel circuit PC which form a pair may constitute one subpixel.

The light-emitting element E may be an OLED including an organic light-emitting layer that is arranged between a pixel electrode and a counter electrode. The pixel electrode and the counter electrode may be respectively an anode and a cathode of the OLED. Alternatively, according to a configuration of the pixel circuit PC, the pixel electrode may be a cathode of the OLED and the counter electrode may be an anode of the OLED. The pixel electrode of the light-emitting element E used herein may refer to an electrode that is currently coupled to the pixel circuit PC but may be separated or isolated from the pixel circuit PC.

A unit pixel may include a plurality of subpixels representing a plurality of colors in order to display various colors. The pixel P used herein generally refers to one subpixel. However, the present embodiment is not limited thereto, and the pixel P may refer to one unit pixel including a plurality of subpixels. That is, one pixel may mean one subpixel or a plurality of subpixels constituting one unit pixel.

Each of the dummy pixels DP includes the dummy pixel circuit DPC. One dummy pixel DP may include a plurality of the dummy pixel circuits DPC. The pixel circuit PC and the dummy pixel circuit DPC may be pixel circuits using an analog driving method. Alternatively, the pixel circuit PC and the dummy pixel circuit DPC may be pixel circuits using a digital driving method.

The dummy pixel DP in embodiments of the present invention may include a light-emitting element. When the dummy pixel DP includes a light-emitting element, the light-emitting element may not actually emit light and may just function as a circuit element. For example, the light-emitting element may function as a capacitor. Although the following embodiments of the present invention will be explained on the assumption that the dummy pixel DP includes only the dummy pixel circuit DPC, a structure of the dummy pixel DP in the embodiments of the present invention is not limited thereto.

One dummy pixel may mean one dummy pixel circuit or a number of dummy pixel circuits corresponding to the number of subpixels constituting one unit pixel.

The controller 140 may control the scan driver 120 and the data driver 130. The controller 140 may control the power supply unit 150 to apply the power voltage ELVDD, the power voltage ELVSS, an emission control signal EM, an initialization voltage Vint to the pixels P. The controller 140 may generate a plurality of control signals including a scan control signal SCS and a data control signal DCS. For example, the controller 140 may generate the scan control signal SCS, the data control signal DCS, and digital image data DATA based on a horizontal synchronization signal and a vertical synchronization signal.

The scan driver 120 may sequentially drive the scan lines SL in response to the scan control signal SCS. For example, the scan control signal SCS may be an instruction signal instructing the scan driver 120 to start to scan the scan lines SL. The scan driver 220 may generate scan signals, and may sequentially apply the scan signals to the pixels P and the dummy pixels DP through the scan lines SL.

The data driver 130 may drive the data lines DL in response to the data control signal DCS and the digital image data DATA. The data driver 130 may convert the digital image data DATA having a gray scale into data signals having a gray scale voltage corresponding to the gray scale, and may sequentially apply the data signals to the pixels P and the dummy pixels DP through the data lines DL.

When the pixel Pij of FIG. 1 is a defective pixel, the dummy pixel DPj may be used to repair the pixel Pij. When the pixel Pij of FIG. 1 is not a defective pixel and a neighboring pixel of a defective pixel, the dummy pixel DPj may be used to repair the defective pixel, and a power voltage applied to the pixel Pij may be applied as a power voltage to the dummy pixel DPj.

For example, when the pixel Pij of FIG. 1 is a defective pixel, the light-emitting element E of the pixel Pij may be separated or isolated from the pixel circuit PC of the pixel Pij, and may be coupled to the dummy pixel DPj of the same column through the repair line RLj of the same column. The light-emitting element E of the pixel Pij may receive driving current that is generated by the dummy pixel circuit DPC of the dummy pixel DPj through the repair line RLj of the same column, and may emit light at a luminance corresponding to the driving current. Because the pixel Pij and the dummy pixel DPj are located at the same column, the defective pixel Pij and the dummy pixel DPj may commonly receive a data signal through the data line DLj of the same column.

Alternatively, when the pixel Pij of FIG. 1 is an adjacent pixel of a defective pixel, the power voltage ELVDD that is applied to the pixel Pij is applied to the dummy pixel DPj through the repair line RLj of the same column. In this case, because only the pixel Pij and the dummy pixel DPj are coupled to the repair line RLj, the amount of current flowing through the repair line RLj is relatively small. Accordingly, no or a very small voltage drop occurs in the repair line RLj, and there is no or a slight difference between a level of the power voltage ELVDD that is applied to the pixel Pij and a level of the power voltage ELVDD that is applied to the dummy pixel DPj. Accordingly, even when the light-emitting element E of the defective pixel emits light according to a driving current that is supplied by the dummy pixel circuit DPC, a luminance of the light-emitting element E of the defective pixel and a luminance of the light-emitting element E of the pixel Pij that is an adjacent pixel of the defective pixel are substantially the same or have a very small difference therebetween that is not perceived by the viewer. Various modifications of the present embodiment will be explained below in more detail.

Although only one pixel Pij and one dummy pixel DPj located in the same column are illustrated in FIG. 1 due to a spatial limitation, it will be understood by one of ordinary skill in the art that the plurality of pixels P and the plurality of dummy pixels DP may be arranged on the display panel 110. Although only the scan line SLi, the data line DLj, and the repair line RLj are illustrated in FIG. 1, it will be understood by one of ordinary skill in the art that n+1 scan lines SL, m data lines DL, and m repair lines RL are arranged on the display panel 110, where m and n are natural numbers and may be the same or different from each other.

Figure 2:
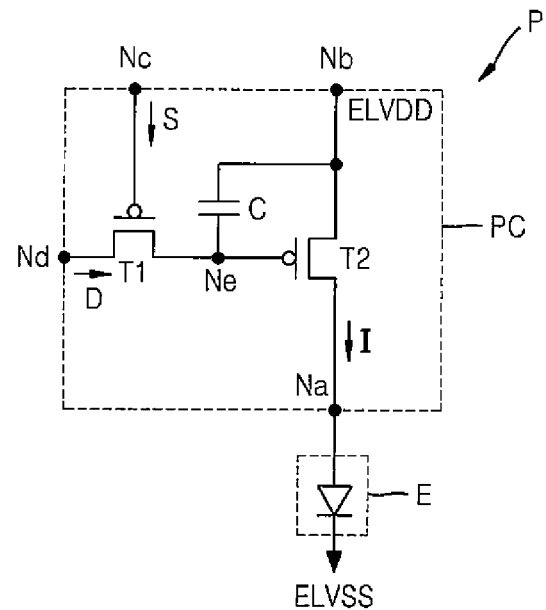
FIG. 2 is a circuit diagram illustrating a pixel of the organic light-emitting display apparatus, according to an embodiment of the present invention.

FIG. 2 is a circuit diagram illustrating the pixel P in the organic light-emitting display apparatus 100, according to an embodiment of the present invention.

Referring to FIG. 2, the pixel P includes the pixel circuit PC and the light-emitting element E. The pixel circuit PC and the light-emitting element E are separably coupled to each other.

The light-emitting element E may be, for example, an OLED including an anode and a cathode. For example, the anode may be coupled to the pixel circuit PC, and a power voltage (e.g., ELVSS) may be applied to the cathode.

The pixel circuit PC includes first through fourth nodes Na, Nb, Nc, and Nd. The first node Na is separably coupled to a pixel electrode (an anode, in FIG. 2) of the light-emitting element E. For example, the first node Na is currently connected to the pixel electrode, and may be separated or isolated during a repair process. The pixel circuit PC may output driving current I through the first node Na. An output node of the pixel circuit PC used herein may refer to a node through output current of the pixel circuit PC flows such as the first node Na of FIG. 2.

The second node Nb is a node to which a power voltage (e.g., the power voltage ELVDD) is applied. Due to the power voltage, the pixel circuit PC is driven and the driving current I is generated. A power node of the pixel circuit PC used herein may refer to a node to which the power voltage of the pixel circuit PC is applied such as the second node Nb of FIG. 2.

The third node Nc is a node that receives a scan signal S, and the fourth node Nd is a node that receives a data signal D.

The pixel circuit PC may include, for example, a switching transistor T1, a driving transistor T2, and a storage capacitor C as shown in FIG. 2. The switching transistor T1 may transfer to a fifth node Ne the data signal D that is applied to the fourth node Nd in response to the scan signal S that is applied to the third node Nc. The storage capacitor C may be coupled between the second node Nb and the fifth node Ne, and may charge a voltage corresponding to the data signal D that is transferred to the fifth node Ne. The driving transistor T2 may output to the first node Na the driving current I corresponding to the voltage charged by the storage capacitor C by using the power voltage that is applied through the second node Nb. The light-emitting element E may emit light at a luminance corresponding to the data signal D due to the driving current I.

The pixel circuit PC of FIG. 2 is merely an example embodiment, and additional transistors and/or an additional capacitor such as a power voltage compensation circuit may be included in the pixel circuit PC in order to perform various functions. Also, although the switching transistor T1 and the driving transistor T2 are illustrated as NMOS transistors in FIG. 2, the pixel circuit PC may include PMOS transistors or a combination of an NMOS transistor and a PMOS transistor.

Although the pixel P of FIG. 2 may operate by using an analog driving method, the present embodiment is not limited thereto and the pixel P may operate by using a digital driving method.

Figure 3:
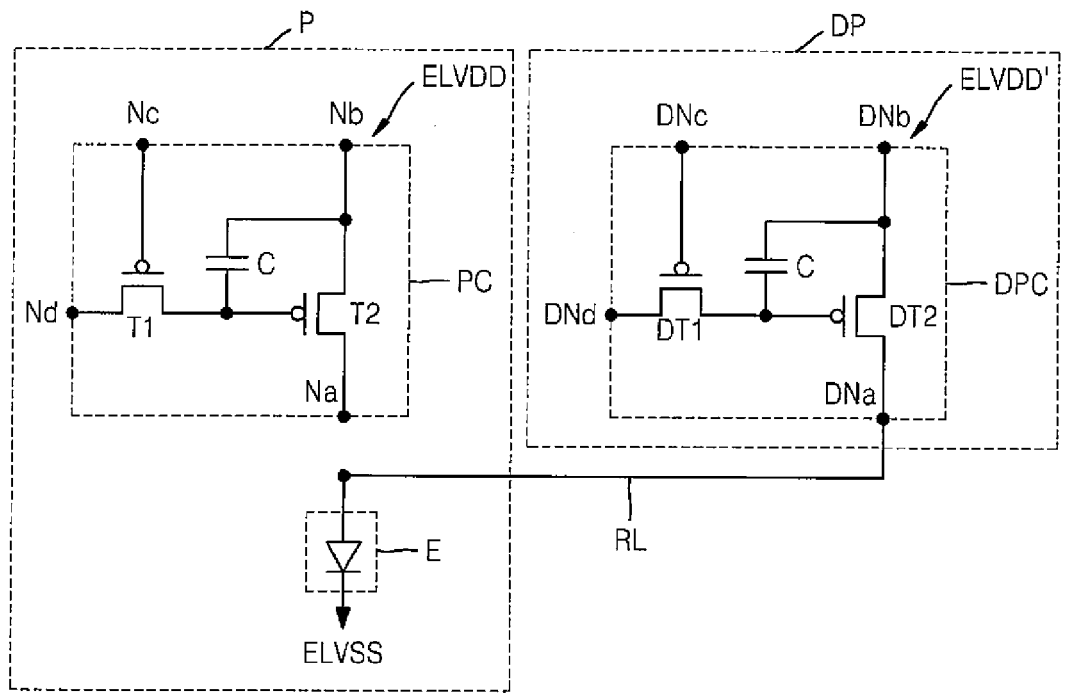
FIG. 3 is a circuit diagram illustrating the pixel of the organic light-emitting display apparatus and a dummy pixel that is coupled to the pixel, according to an embodiment of the present invention.

FIG. 3 is a circuit diagram illustrating the pixel P in the organic light-emitting display apparatus 100 and the dummy pixel DP that is coupled to the pixel P, according to an embodiment of the present invention.

The pixel P of FIG. 3 includes the same pixel circuit as the pixel circuit PC of FIG. 2. The dummy pixel DP includes the dummy pixel circuit DPC.

In the pixel circuit PC of the pixel P, the first node Na is separably coupled to the pixel electrode of the light-emitting element E of the pixel P, and may be separated or isolated during a repair process. The pixel electrode of the light-emitting element E that is separated or isolated from the pixel circuit PC due to the first node Na is arranged to be connectable to the repair line RL and may be coupled to the repair line RL during a repair process.

The dummy pixel circuit DPC may include first through fourth dummy nodes respectively corresponding to the first through fourth nodes Na, Nb, Nc, and Nd of the pixel circuit PC. The first through fourth dummy nodes may be respectively denoted by 'DNa', 'DNc', and 'DNd'. For example, the dummy pixel circuit DPC may be the same as the pixel circuit PC in terms of a circuit configuration. Alternatively, the dummy pixel circuit DPC may be different from the pixel circuit PC.

In the dummy pixel circuit DPC of the dummy pixel DP, the first dummy node DNa is coupled to the repair line RL or is connectably arranged and may be coupled to the repair line RL during a repair process. Referring to FIG. 3, the repair line RL may couple the pixel electrode of the light-emitting element E of the pixel P and the dummy pixel circuit DPC.

Another repair line may be coupled to the second dummy node DNb. The another repair line may connect a neighboring pixel that is located around the pixel P and the dummy pixel circuit DPC. For example, the other repair line may apply to the second dummy node DNb the power voltage ELVDD that is applied to the neighboring pixel of the pixel P, which will be explained below in more detail.

The third dummy node DNc receives the scan signal S from the scan line SLn+1, and the fourth dummy node DNd receives the data signal D from the data line DL. The same data signal may be applied to the fourth dummy node DNd and the fourth node Nd.

Figure 4:
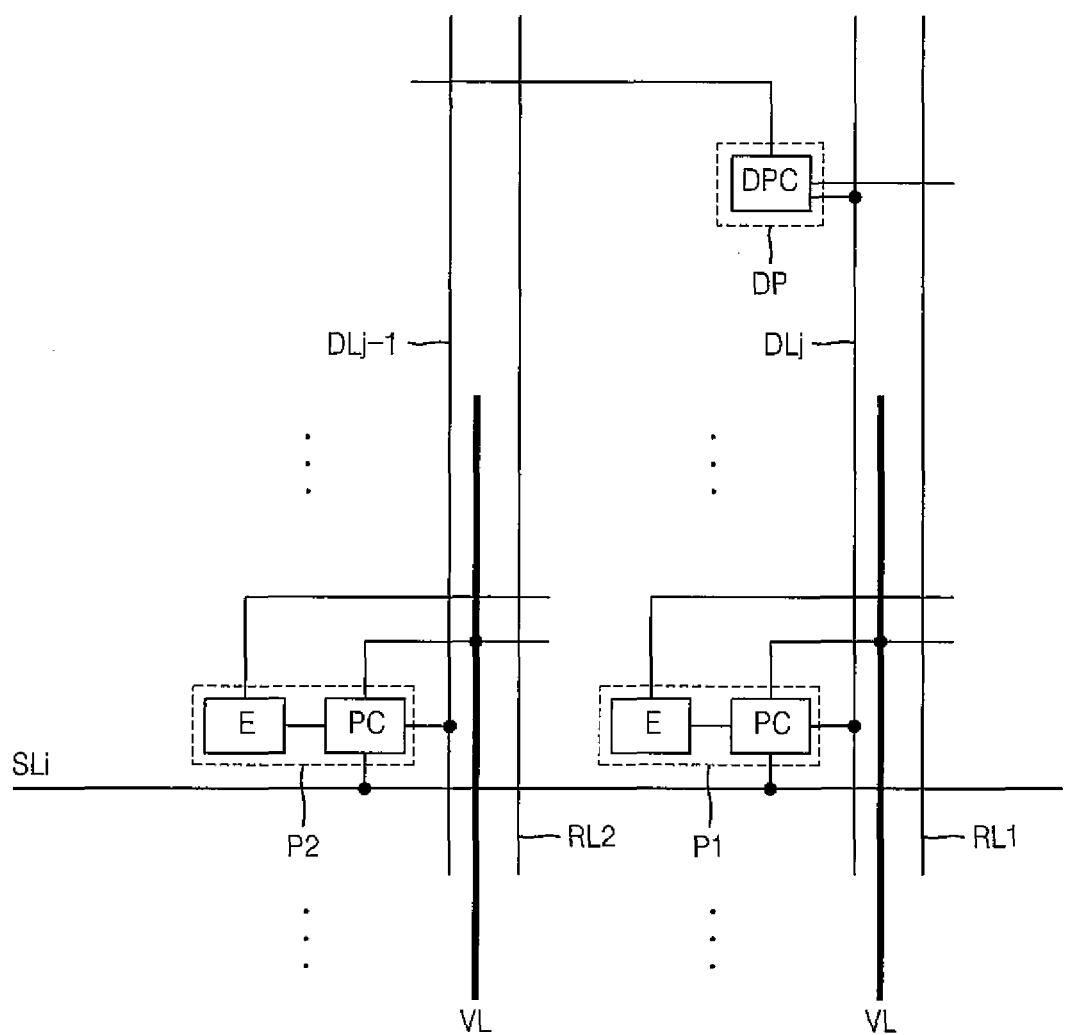
FIG. 4 is a diagram illustrating a display panel of FIG. 1, according to an embodiment of the present invention.

FIG. 4 is a diagram illustrating the display panel 110 of FIG. 1, according to an embodiment of the present invention.

Referring to FIG. 4, two pixels P and one dummy pixel DP are illustrated for convenience of explanation. A first pixel P1 is coupled to the voltage line VL, the ith scan line SLi, and the jth data line DLj. A second pixel P2 is coupled to the voltage line VL, the ith scan line SLi, and a j−1th data line DLj−1. The dummy pixel DPj is coupled to the jth data line DLj.

Other pixels and other dummy pixels are not shown in FIG. 4. Also, other scan lines SL, other data lines DL, and other repair lines RL are not shown. Although detailed structures of the pixel circuit PC, the light-emitting element E, and the dummy pixel circuit DPC are not shown in FIG. 4, the detailed structures may be the same as those described with reference to FIG. 3.

In each of the first pixel P1 and the second pixel P2, the pixel circuit PC and the light-emitting element E are separably coupled to each other. The light-emitting element E of the first pixel P1 is connectable to a first repair line RL1. The power node of the pixel circuit PC of the first pixel P1 is coupled to the voltage line VL, and is connectable to the first repair line RL1. The light-emitting element E of the second pixel P2 is connectable to a second repair line RL2. The power node of the pixel circuit PC of the second pixel P2 is coupled to the voltage line VL, and is connectable to the second repair line RL2. The dummy pixel circuit DPC of the dummy pixel DP is coupled to the first repair line RL1 and/or the second repair line RL2, or is configured to be coupled to the first repair line RL1 and/or the second repair line RL2.

Figure 5:
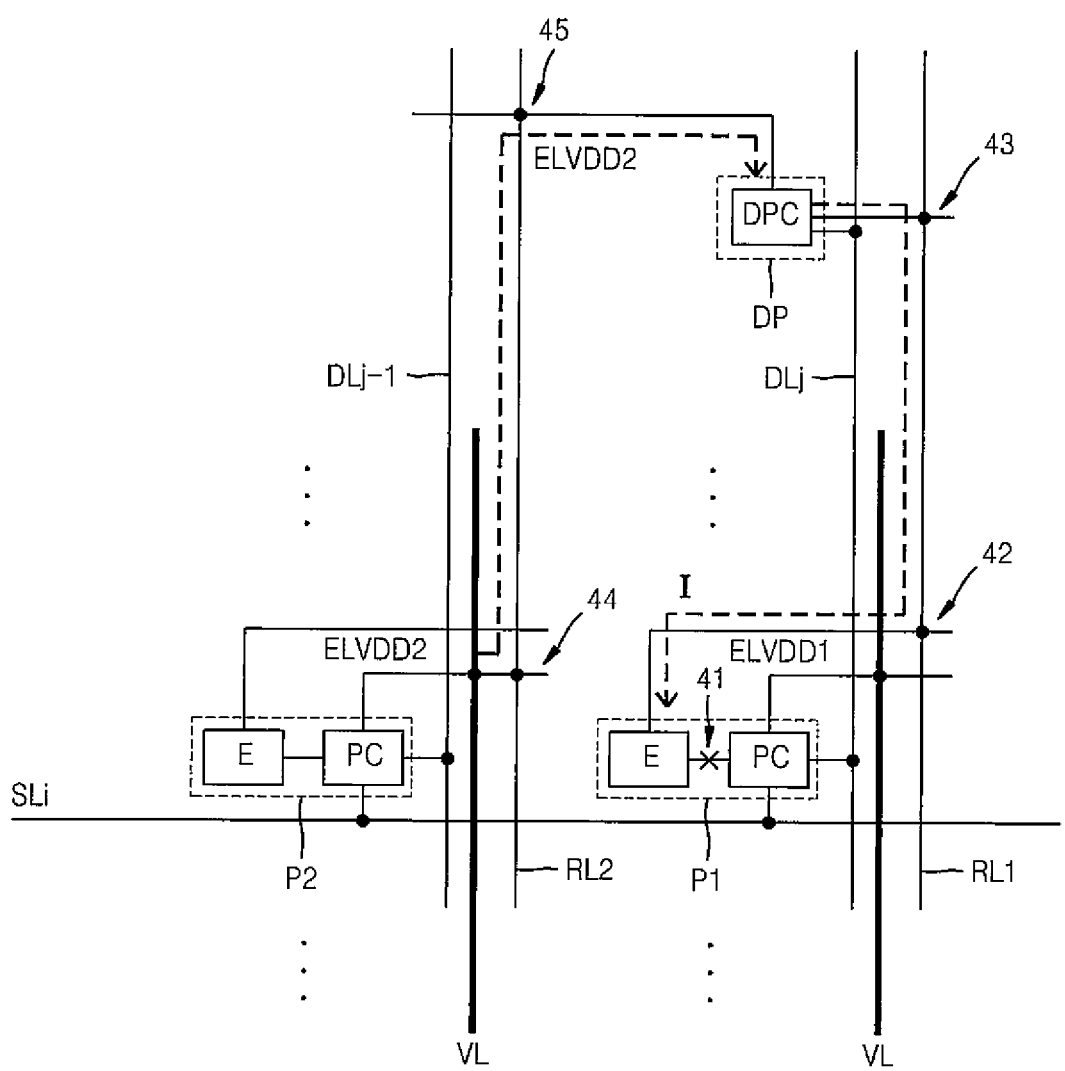
FIG. 5 is a diagram for explaining a method of repairing a defective pixel in the display panel of FIG. 4, according to an embodiment of the present invention.

FIG. 5 is a diagram for explaining a method of repairing a defective pixel in the display panel 110 of FIG. 4, according to an embodiment of the present invention. For example, the method of repairing the first pixel P1, it is assumed that a defect occurs in the first pixel P1, by using the dummy pixel DP in the same column will be explained. 4. Referring to FIG. 5, the second pixel P2 may be further used to repair the first pixel P1.

Referring to FIG. 5, the light-emitting element E of the first pixel P1 is electrically separated or isolated from the pixel circuit PC of the first pixel P1. For example, the light-emitting element E and the pixel circuit PC may be separated or isolated from each other by cutting by emitting a laser beam to a connection region 41 between the light-emitting element E and the pixel circuit PC.

The light-emitting element E of the first pixel P1 is electrically coupled to the dummy pixel circuit DPC (for example, an output node of the dummy pixel circuit DPC) of the dummy pixel DP. To this end, the pixel electrode of the light-emitting element E of the first pixel P1 is coupled to the first repair line RL1 of the same column. For example, the pixel electrode of the light-emitting element E is electrically coupled to the first repair line RL1 by emitting a laser beam to an overlap region 42 between a connection member (e.g., a branch line) that is connected to the pixel electrode of the light-emitting element E of the first pixel P1 and the first repair line RL1 of the same column.

The dummy pixel circuit DPC is coupled to the first repair line RL1. For example, the output node of the dummy pixel circuit DPC is electrically coupled to the first repair line RL1 by emitting a laser beam to an overlap region 43 between a connection member (e.g., a branch line) coupled to the output node of the dummy pixel circuit DPC and the first repair line RL1 of the same column. Accordingly, the driving current I that is output from the output node of the dummy pixel circuit DPC may flow through the first repair line RL1 to the light-emitting element E of the first pixel P1.

The light-emitting element E of the first pixel P1 emits light at a luminance corresponding to a data signal Dj due to the driving current I. If levels of the power voltages ELVDD1 and ELVDD2 respectively applied to the first pixel P1 and the second pixel P2 that are adjacent to each other are the same, a luminance of the first pixel P1 is almost the same as a luminance when the first pixel P1 is not a defective pixel. Also, a luminance of the first pixel P1 is almost the same as a luminance of the second pixel P2 that is adjacent to the first pixel P1, and even when there is a slight difference therebetween, it may be difficult for the viewer to perceive the slight difference.

The power node of the dummy pixel circuit DPC of the dummy pixel DP is electrically coupled to the power node of the pixel circuit PC of the second pixel P2 through the second repair line RL2. The second pixel P2 is a neighboring pixel of the first pixel P1 that is a defective pixel. To this end, the power node of the pixel circuit PC of the second pixel P2 is coupled to the second repair line RL2 in the same column. For example, the power node of the pixel circuit PC of the second pixel P2 is electrically coupled to the second repair line RL2 by emitting a laser beam to an overlap region 44 between the second repair line RL2 of the same column and a connection member (for example, a branch line) coupled to the power node of the pixel circuit PC of the second pixel P2.

The dummy pixel circuit DPC is coupled to the second repair line RL2. For example, the power node of the dummy pixel circuit DPC is electrically coupled to the second repair line RL2 by emitting a laser beam to an overlap region 45 between the second repair line RL2 and a connection member (for example, a branch line) coupled to the power node of the dummy pixel circuit DPC. Accordingly, the power voltage ELVDD2 applied to the power node of the pixel circuit PC of the second pixel P2 may be applied to the power node of the dummy pixel circuit DPC.

Because the second repair line RL2 itself has a line resistance, an IR-drop may occur, and thus a level of the power voltage ELVDD2 of the second pixel P2 may be slightly reduced while being applied to the dummy pixel circuit DPC. However, the reduction of the power voltage ELVDD2 of the second pixel P2 is negligibly small. Accordingly, a level difference between the power voltage ELVDD2 applied to the second pixel P2 and the power voltage ELVDD2 applied to the dummy pixel DP is very small, and thus, a luminance difference between the first pixel P1 and the second pixel P2 due to this very small level difference may not be perceived by the viewer.

Referring to FIG. 5, in conclusion, the first repair line RL1 may transfer the driving current I that is output from the dummy pixel circuit DPC to the light-emitting element E of the first pixel P1, and the second repair line RL2 may transfer the power voltage ELVDD2 of the second pixel P2 to the power node of the dummy pixel circuit DPC.

In order to inactivate the pixel circuit PC of the first pixel P1, the power node of the first pixel P1 may be separated or isolated from the voltage line VL by using, for example, a laser beam.

Although the second pixel P2 is located in the same row as the first pixel P1 and is located in an adjacent column with respect to the first pixel P1, the present embodiment is not limited thereto. In FIG. 5, a power voltage of the second pixel P2 is used is to prevent (or substantially prevent) a luminance of the first pixel P1 that has been repaired from being different from that of surrounding pixels. Accordingly, the second pixel P2 may be any pixel, instead of an adjacent pixel of the first pixel P1, as long as the second pixel P2 is a neighboring pixel of the first pixel P1. For example, as long as the power voltage ELVDD2 of the second pixel P2 and the power voltage ELVDD1 of the first pixel P1 are substantially the same or similar to each other, the second pixel P2 that is used to repair the first pixel P1 may be located at any position in the vicinity of the first pixel P1.

Figure 6:
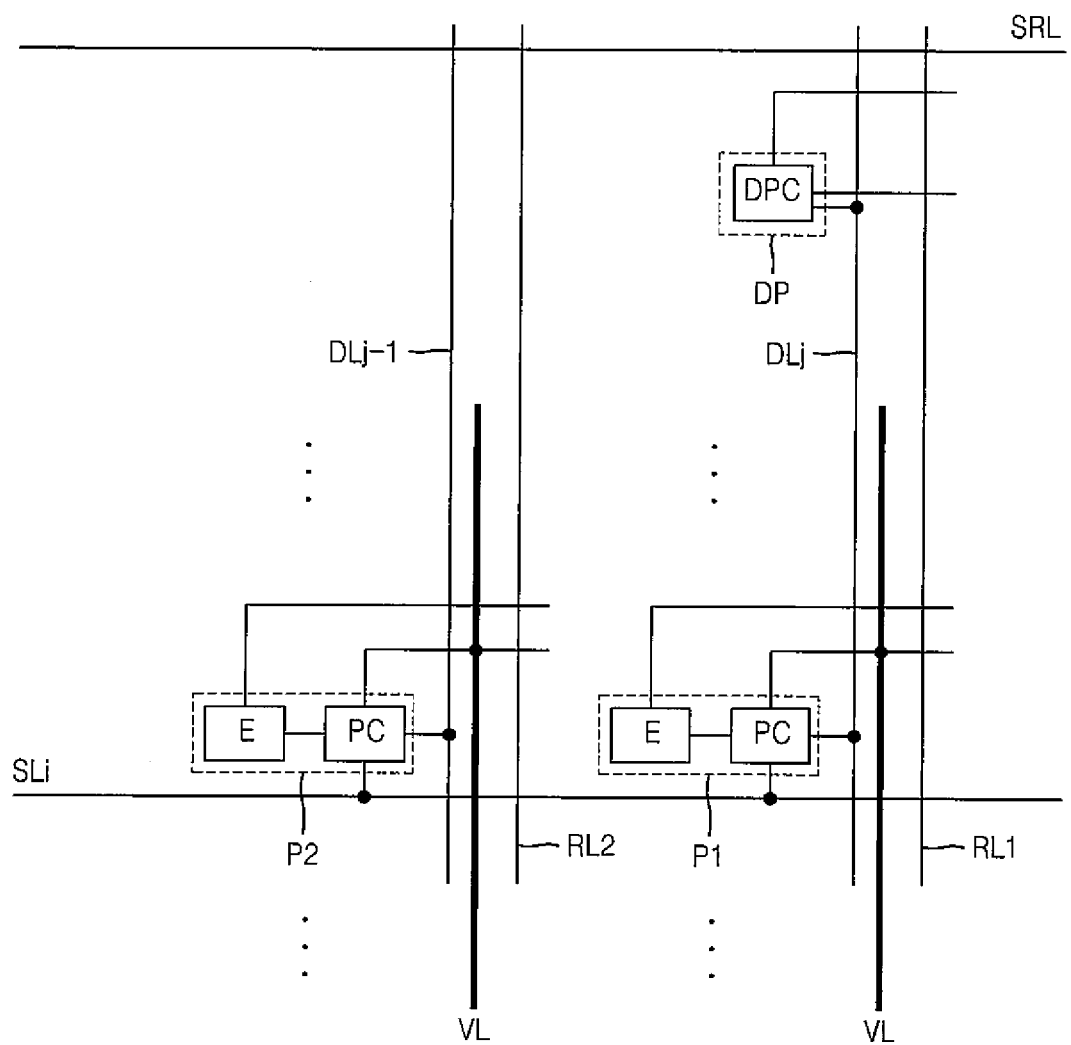
FIG. 6 is a diagram illustrating the display panel of FIG. 1, according to another embodiment of the present invention.

FIG. 6 is a diagram illustrating the display panel 110 of FIG. 1, according to another embodiment of the present invention.

Referring to FIG. 6, like in FIG. 4, two pixels P and one dummy pixel DP are illustrated for convenience of explanation. Referring to FIG. 6, the same elements as those in FIG. 4 are denoted by the same reference numerals. Accordingly, the description already provided for the display panel 110 of FIG. 4 may apply to the display panel 110 of FIG. 6.

In FIG. 6, the dummy pixel circuit DPC of the dummy pixel DP is coupled to the first repair line RL1, or is configured to be coupled to the first repair line RL1. For example, a power node of the dummy pixel circuit DPC of the dummy pixel DP is coupled to the first repair line RL1 or is configured to be coupled to the first repair line RL1.

Unlike in FIG. 4, the display panel 110 of FIG. 6 may further include an auxiliary repair line SRL that couples the first repair line RL1 and the second repair line RL2. Referring to FIG. 6, a connection member coupled to the power node of the dummy pixel circuit DPC and a connection member connected to the output node of the dummy pixel circuit DPC are configured to be coupled to the first repair line RL1. In this case, the auxiliary repair line SRL may be used to form an electrical path between the second repair line RL1 and the power node of the dummy pixel circuit DPC.

Figure 7:
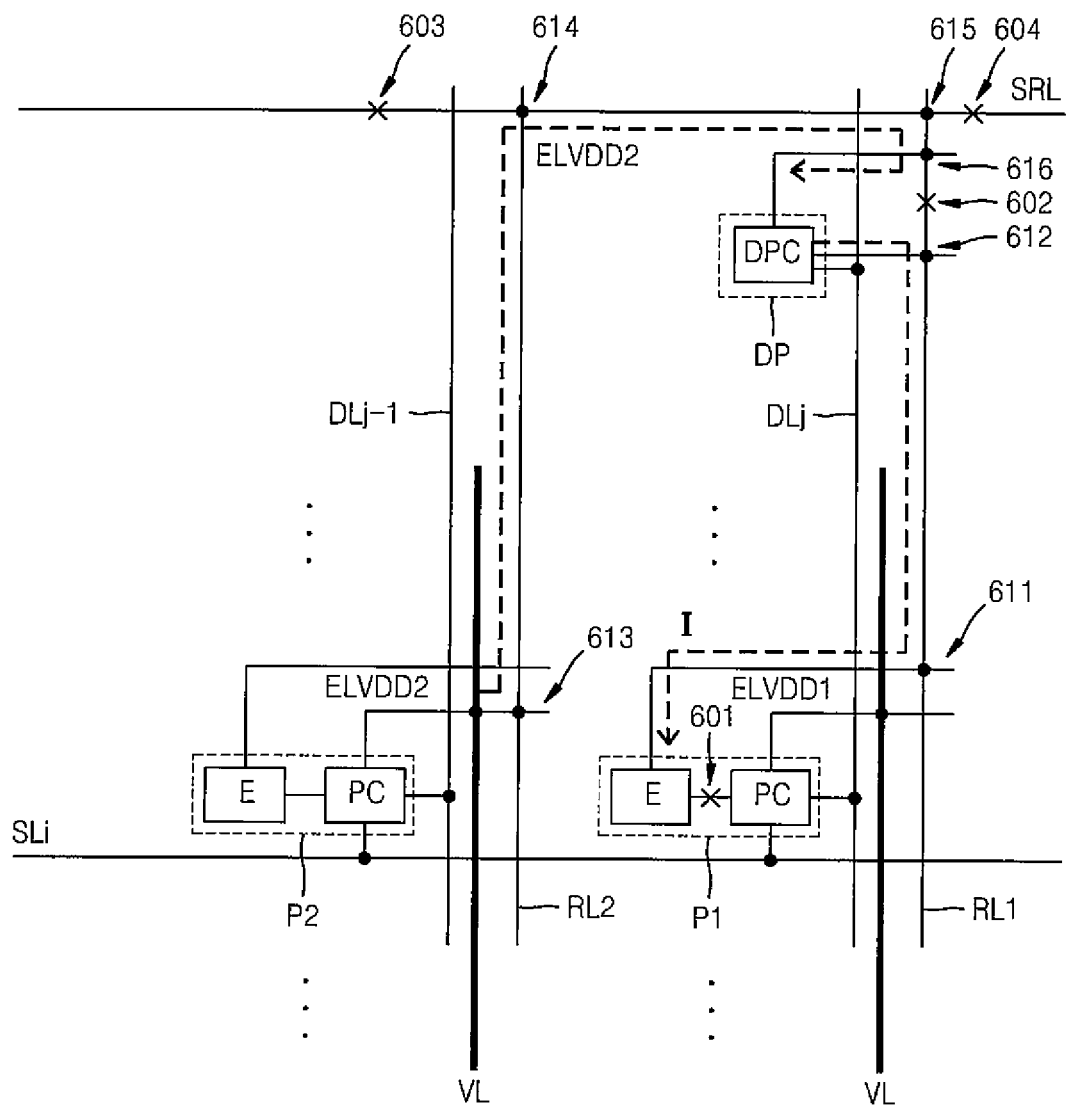
FIG. 7 is a diagram for explaining a method of repairing a defective pixel in the display panel of FIG. 6, according to an embodiment of the present invention.

FIG. 7 is a diagram for explaining a method of repairing a defective pixel in the display panel 110 of FIG. 6, according to an example embodiment of the present invention. For example, FIG. 7 is a diagram for explaining a method of repairing the first pixel P1, assuming a defect occurs in the first pixel P1, by using the dummy pixel DP in the same column. Referring to FIG. 7, the second pixel P2 and the auxiliary repair line SRL may be further used to repair the first pixel P1.

Referring to FIG. 7, the light-emitting element E of the first pixel P1 is electrically separated or isolated from the pixel circuit PC of the first pixel P1. For example, the light-emitting element E and the pixel circuit PC may be separated or isolated from each other by performing cutting by emitting a laser beam to a connection region 601 between the light-emitting element E and the pixel circuit PC.

The light-emitting element E of the first pixel P1 is electrically coupled to the dummy pixel circuit DPC (that is, to the output node of the dummy pixel circuit DPC) of the dummy pixel DP. To this end, the pixel electrode of the light-emitting element E of the first pixel P1 is coupled to the first repair line RL1 of the same column. For example, the first repair line RL1 and a connection member (e.g., a branch line) coupled to the pixel electrode of the light-emitting element E of the first pixel p1 are coupled to each other by emitting a laser beam to an overlap region 611 between the first repair line RL1 of the same column and the connection member coupled to the pixel electrode of the light-emitting element E of the first pixel P1. Accordingly, the pixel electrode of the light-emitting element E is electrically coupled to the first repair line RL1.

The dummy pixel circuit DPC is coupled to the first repair line RL1. For example, the output node of the dummy pixel circuit DPC is electrically coupled to the first repair line RL1 by emitting a laser beam to an overlap region 612 between the first repair line RL1 of the same column and a connection member (for example, a branch line) coupled to the output node of the dummy pixel circuit DPC. Accordingly, the driving current I that is output from the output node of the dummy pixel circuit DPC may flow to the light-emitting element E of the first pixel P1 through the first repair line RL1.

Due to the driving current I, the light-emitting element E of the first pixel P1 emits light with a luminance corresponding to the data signal Dj. When it is assumed that levels of the power voltages ELVDD1 and ELVDD2 that are respectively applied to the first pixel P1 and the second pixel P2 that are adjacent to each other are almost the same, a luminance of the first pixel P1 that is repaired is almost the same as a luminance when the first pixel P1 operates normally. Also, a luminance of the first pixel P1 is almost the same as a luminance of the second pixel P2 that is adjacent to the first pixel P1, and even when there is a slight difference between the luminance of the first pixel P1 and the luminance of the second pixel P2, it is difficult for the viewer to perceive this slight difference.

The power node of the dummy pixel circuit DPC of the dummy pixel DP is electrically coupled to the power node of the pixel circuit PC of the second pixel P2 that is a neighboring pixel of the first pixel P1 that is a defective pixel through the second repair line RL2. To this end, the power node of the pixel circuit PC of the second pixel P2 is connected to the second repair line RL2 of the same column. For example, the power node of the pixel circuit PC of the second pixel P2 is electrically coupled to the second repair line RL2 by emitting a laser beam to an overlap region 613 between the second repair line RL2 of the same column and a connection member (for example, a branch line) coupled to the power node of the pixel circuit PC of the second pixel P2.

The auxiliary repair line SRL is used to form an electrical path between the dummy pixel circuit DPC and the second repair line RL2. For example, the second repair line RL2 and the auxiliary repair line SRL are coupled to each other in an overlap region 614, the auxiliary repair line SRL and the first repair line RL1 are coupled to each other in an overlap region 615, and the first repair line RL1 and a connection member (for example, a branch line) coupled to the power node of the dummy pixel circuit DPC are coupled to each other in an overlap region 616. Accordingly, the power node of the dummy pixel circuit DPC is electrically coupled to the second repair line RL2. The power voltage ELVDD2 applied to the power node of the pixel circuit PC of the second pixel P2 may be applied to the power node of the dummy pixel circuit DPC through the second repair line RL2, the auxiliary repair line SRL, and the first repair line RL1. Two conductive members may be coupled in each overlap region by emitting a laser beam.

Both outer edges 603 and 604 of a portion of the auxiliary repair line SRL that connects the first repair line RL1 and the second repair line RL2 may be cut. Accordingly, other portions of the auxiliary repair line SRL may be used to repair another defective pixel. The cutting may be performed by, for example, emitting a laser beam.

Referring to FIG. 7, the first repair line RL1 transfers an output current of the dummy pixel circuit DPC to the first pixel P1, and applies the power voltage ELVDD2 of the second pixel P2 to the dummy pixel circuit DPC. To perform these functions, the first repair line RL1 may be divided into two. For example, a portion 602 of the first repair line RL1 between the overlap region 616 between the connection member of the power node of the dummy pixel circuit DPC and the first repair line RL1 and the overlap region 612 between the connection member of the output node of the dummy pixel circuit DPC and the first repair line RL1 may be cut.

Because the second repair line RL2, the auxiliary repair line SRL, and the first repair line RL1 themselves have a line resistance, an IR-drop may occur. Accordingly, a voltage level may be slightly reduced while the power voltage ELVDD2 of the second pixel P2 is transferred to the dummy pixel circuit DPC. However, the reduction of the voltage level may be negligibly small. Accordingly, a level difference between the power voltage ELVDD2 applied to the second pixel P2 and the power voltage ELVDD2 applied to the dummy pixel DP may be very small, and a luminance difference between the first pixel P1 and the second pixel P2 due to the very small level difference may not be perceived by the viewer.

Referring to FIG. 7, in conclusion, the first repair line RL1 may transfer the driving current I of the dummy pixel circuit DPC to the light-emitting element E of the first pixel P1, and the second repair line RL2 may transfer the power voltage ELVDD2 of the second pixel P2 to the power node of the dummy pixel circuit DPC.

In order to inactivate the pixel circuit PC of the first pixel P1, the power node of the first pixel P1 may be separated or isolated from the voltage line VL by using, for example, a laser beam.

Although the second pixel P2 is located in the same row as the first pixel P1 and is located at an adjacent column with respect to the first pixel P1, the present embodiment is not limited thereto. In FIG. 7, a power voltage of the second pixel P2 is used is to prevent (or substantially prevent) a luminance of the first pixel P1 that has been repaired from being different from that of surrounding pixels. Accordingly, the second pixel P2 may be any pixel, instead of an adjacent pixel of the first pixel P1, as long as the second pixel P2 is a neighboring pixel of the first pixel P. For example, as long as the power voltage ELVDD2 of the second pixel P2 and the power voltage ELVDD1 of the first pixel P1 are substantially the same or similar to each other, the second pixel P2 that is used to repair the first pixel P1 may be located at any position.

Figure 8:
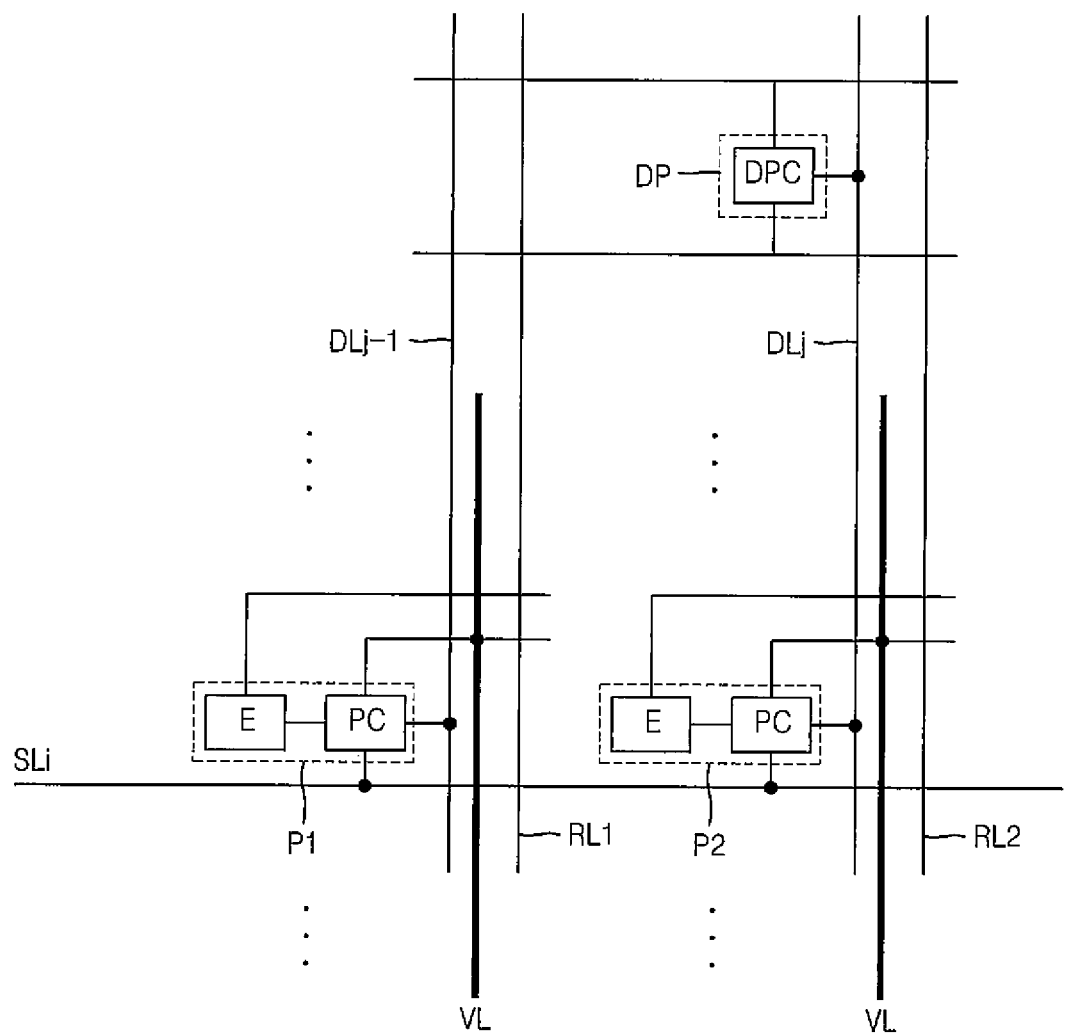
FIG. 8 is a diagram illustrating the display panel of FIG. 1, according to another embodiment of the present invention.

FIG. 8 is a diagram illustrating the display panel 110 of FIG. 1, according to another embodiment of the present invention.

Referring to FIG. 8, like in FIG. 4, two pixels P and one dummy pixel DP are illustrated for convenience of explanation. Although omitted below, the description already presented for the display panel 110 of FIG. 4 may apply to the display panel 110 of FIG. 8.

In FIG. 8, the dummy pixel circuit DPC of the dummy pixel DP is coupled to the first repair line RL1 and the second repair line RL2, or is configured to be coupled to the first repair line RL1 and the second repair line RL2. For example, the power node and the output node of the dummy pixel circuit DPC of the dummy pixel DP are coupled to the first repair line RL1 and the second repair line RL2, or are configured to be coupled to the first repair line RL1 and the second repair line RL2. For example, a connection member of the power node of the dummy pixel circuit DPC may overlap to be connectable to both the first repair line RL1 and the second repair line RL2, and a connection member of the output node of the dummy pixel circuit DPC may overlap to be connectable to both the first repair line RL1 and the second repair line RL2, as shown in FIG. 8.

In this structure, a driving current that is output from the dummy pixel circuit DPC according to a repair process may be transferred to the second pixel P2 in the same column or the first pixel P1 in an adjacent column through a repair line of the same column or a repair line of an adjacent column. Also, a driving voltage that is applied to the dummy pixel circuit DPC according to the repair process may be transferred from the second pixel P2 in the same column or the first pixel P1 in the adjacent column through the repair line of the same column or the repair line of the adjacent column. A method of repairing a defective pixel by using the dummy pixel DP in the same column has been explained in FIGS. 4 through 7. A method of repairing a defective pixel by using the dummy pixel DP in an adjacent column will be explained with reference to FIGS. 8 and 9.

Figure 9:
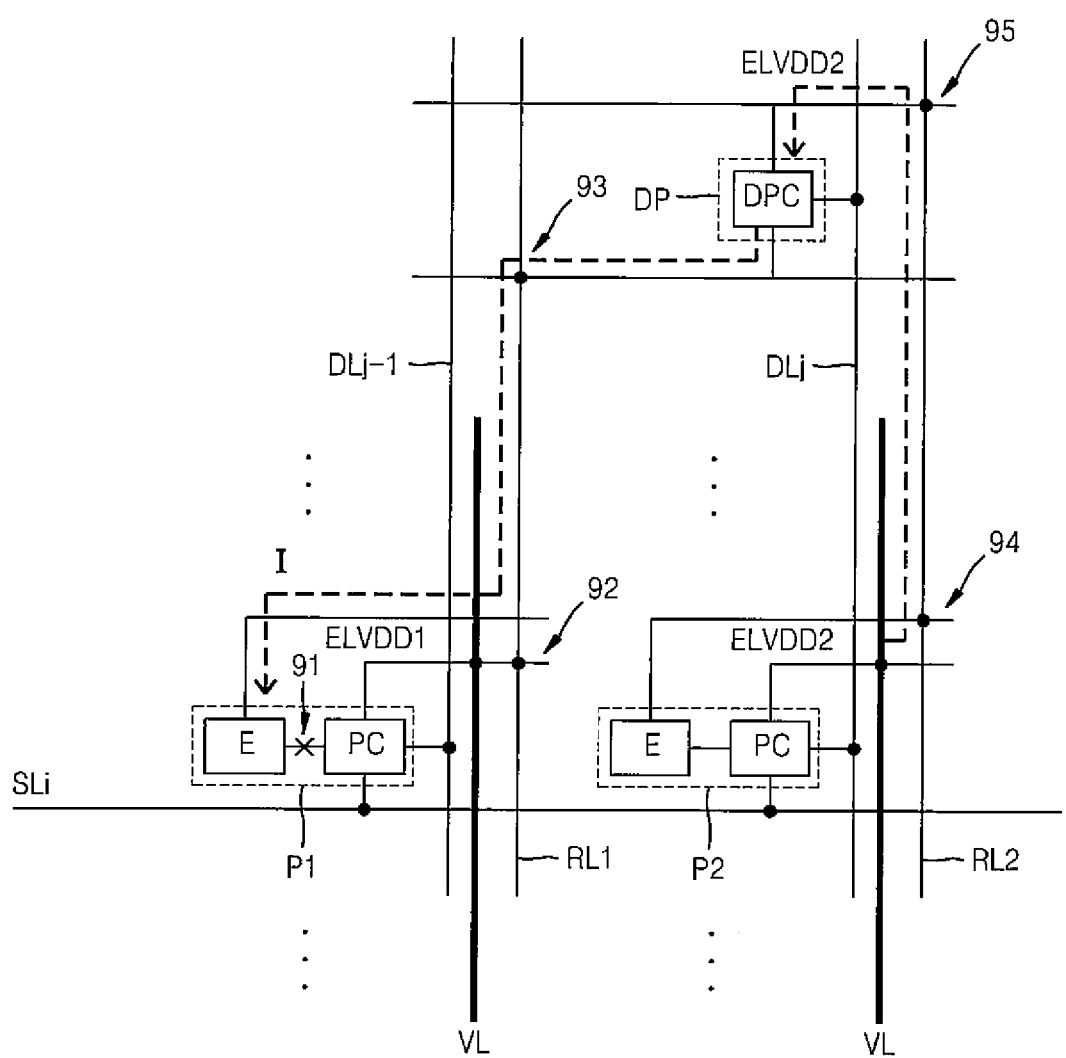
FIG. 9 is a diagram for explaining a method of repairing a defective pixel in the display panel of FIG. 8, according to an embodiment of the present invention.

FIG. 9 is a diagram for explaining a method of repairing a defective pixel in the display panel 110 of FIG. 8, according to an embodiment of the present invention.

For example, FIG. 9 is a diagram for explaining a method of repairing the first pixel P1, it is assumed that a defect occurs in the first pixel P1, by using the dummy pixel DP in an adjacent column. Referring to FIG. 9, the second pixel P2 that is located in the same column as the dummy pixel DP may be further used to repair the first pixel P1.

Referring to FIG. 9, the light-emitting element E of the first pixel P1 is electrically separated or isolated from the pixel circuit PC of the first pixel P1. For example, the light-emitting element E and the pixel circuit PC may be separated or isolated from each other by performing cutting by emitting a laser beam to a connection region 91 between the light-emitting element E and the pixel circuit PC.

The light-emitting element E of the first pixel P1 is electrically coupled to the dummy pixel circuit DPC (that is, to the output node of the dummy pixel circuit DPC) of the dummy pixel DP in the adjacent column with respect to the first pixel P1. To this end, the pixel electrode of the light-emitting element E of the first pixel P1 is coupled to the first repair line RL1 in the same column. For example, a connection member (e.g., a branch line) coupled to the pixel electrode of the light-emitting element E of the first pixel P1 and the first repair line RL1 are coupled to each other in an overlap region 92 by emitting a laser beam to the overlap region 92 between the first repair line RL1 in the same column and the connection member coupled to the pixel electrode of the light-emitting element E of the first pixel P1. Accordingly, the pixel electrode of the light-emitting element E is electrically coupled to the first repair line RL1.

The dummy pixel circuit DPC is provided to be connectable to the repair line RL1 of the adjacent column as well as to the repair line RL2 of the same column as shown in FIG. 9. In FIG. 9, the dummy pixel circuit DPC is coupled to the first repair line RL1 in the adjacent column. For example, the output node of the dummy pixel circuit DPC is electrically coupled to the first repair line RL1 by emitting a laser beam to an overlap region 93 between the first repair line RL1 of the adjacent column and a connection member (for example, a branch line) coupled to the output node of the dummy pixel circuit DPC. Accordingly, the driving current I that is output from the output node of the dummy pixel circuit DPC may flow to the light-emitting element E of the first pixel P1 through the first repair line RL1. Thus, the light-emitting element E of the first pixel P1 emits light with a luminance corresponding to the data signal Dj.

The power node of the dummy pixel circuit DPC is electrically coupled through the second repair line RL2 to the power node of the pixel circuit PC of the second pixel P2 that is an adjacent pixel with respect to the first pixel P1. To this end, the power node of the pixel circuit PC of the second pixel P2 is coupled to the second repair line RL2 in the same column. For example, the power node of the pixel circuit PC of the second pixel P2 is electrically coupled to the second repair line RL2 by emitting a laser beam to an overlap region 94 between the second repair line RL2 in the same column and a connection member (for example, a branch line) coupled to the power node of the pixel circuit PC of the second pixel P2.

When it is assumed that levels of the power voltages ELVDD1 and ELVDD2 that are respectively applied to the first pixel P1 and the second pixel P2 that are adjacent to each other are almost the same, a luminance of the first pixel P1 that has been repaired is almost the same as a luminance of the first pixel P1 in a normal operating state. Also, a luminance of the first pixel P1 is almost the same as a luminance of the second pixel P2 that is adjacent to the first pixel P1, and even when there is a slight difference between the luminance of the first pixel P1 and the luminance of the second pixel P2, it is difficult for the viewer to perceive this slight difference.

Because the second repair line RL2 itself has a line resistance, an IR-drop may occur. Accordingly, a voltage level may be slightly reduced while the power voltage ELVDD2 of the second pixel P2 is transferred to the dummy pixel circuit DPC. However, the reduction of the voltage level may be negligibly small. Accordingly, a level difference between the power voltage ELVDD2 applied to the second pixel P2 and the power voltage ELVDD2 applied to the dummy pixel DP may be very small, and thus, a luminance difference between the first pixel P1 and the second pixel P2 due to the very small level difference may not be perceived by the viewer.

Referring to FIG. 9, in conclusion, the first repair line RL1 may transfer the driving current I of the dummy pixel circuit DPC to the light-emitting element E of the first pixel P1, and the second repair line RL2 may transfer the power voltage ELVDD2 of the second pixel P2 to the power node of the dummy pixel circuit DPC.

In order to inactivate the pixel circuit PC of the first pixel P1, the power node of the first pixel P1 may be separated or isolated from the voltage line VL by using, for example, a laser beam.

Although the second pixel P2 is located in the same row as the first pixel P1 and is also located in an adjacent column with respect to the first pixel P1, the present embodiment is not limited thereto. In FIG. 9, a power voltage of the second pixel P2 is used in order to prevent (or substantially prevent) a luminance of the first pixel P1 that has been repaired from being different from that of surrounding pixels. Accordingly, the second pixel P2 may be any pixel, instead of an adjacent pixel with respect to the first pixel P1 as long as the second pixel P2 is a pixel neighboring the first pixel P1. For example, as long as the power voltage ELVDD2 of the second pixel P2 and the power voltage ELVDD1 of the first pixel P1 are substantially the same or similar to each other, the second pixel P2 that is used to repair the first pixel P1 may be located at any position in the vicinity of the first pixel P1.

Referring to FIGS. 4 through 9, when a defect occurs in the first pixel P1 of the display panel 110, the dummy pixel DP in the same column as the first pixel P1 may be used to repair the first pixel P1. The second pixel P2 that is a neighboring pixel of the first pixel P1 may be used to supply a driving power to the dummy pixel DP that is used to repair the first pixel P1. Alternatively, when a defect occurs in the first pixel P1 of the display panel 110, the dummy pixel DP that is located in an adjacent column with respect to the first pixel P1 may be used to repair the first pixel P1. The second pixel P2 that is located in the same column as the dummy pixel DP and is adjacent to the first pixel P1 may be used to supply a driving power to the dummy pixel DP that is used to repair the first pixel P1.

An adjacent pixel that is located at the left of a defective pixel is used to repair the defective pixel in FIGS. 5 and 7, whereas an adjacent pixel that is located at the right of the defective pixel is used to repair the defective pixel in FIG. 9. Also, a dummy pixel in the same column as a defective pixel is used to repair the defective pixel in FIGS. 5 and 7, whereas a dummy pixel of an adjacent column to the defective pixel is used to repair the defective pixel in FIG. 9. As such, because various modifications may be made to the embodiments of the present invention, a defective pixel may be repaired in various ways while minimizing the number of dummy pixels and repair lines provided in a display panel.

Figure 10:
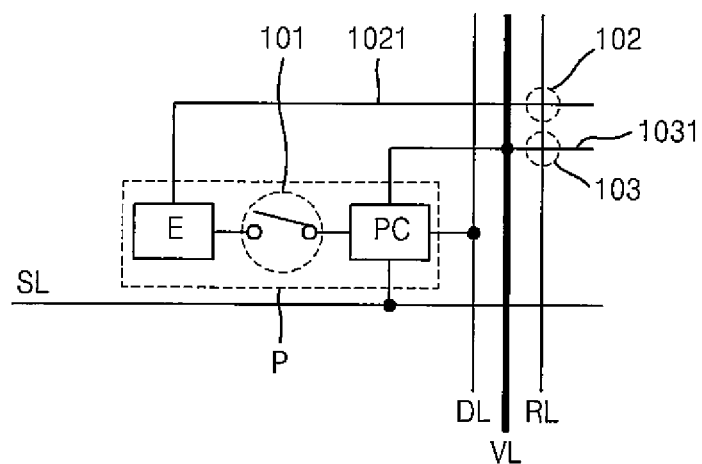
FIG. 10 is a diagram illustrating the pixel and lines around the pixel, according to an embodiment of the present invention.

FIG. 10 is a diagram illustrating the pixel P and lines around the pixel P, according to an embodiment of the present invention.

Referring to FIG. 10, the pixel P that is coupled to the scan line SL and the data line DL includes the pixel circuit PC and the light-emitting element E. The pixel circuit PC and the light-emitting element E are separable from each other in a cutting portion 101. A current connection member 1021 that is coupled to the pixel electrode of the light-emitting element E overlaps the repair line RL in an overlap portion 102, and is connectable to the repair line RL. A power connection member 1031 that is coupled to the power node of the pixel circuit PC is coupled to the voltage line VL, overlaps the repair line RL in an overlap portion 103, and is connectable to the repair line RL. When the power connection member 1031 and the repair line RL are coupled in the overlap portion 103, the voltage line VL and the repair line RL are connected to each other. The repair line RL supplies a driving current to the pixel P or transfers a power voltage from the pixel P to another element. That is, two conductive members may be coupled to each other in one of the two overlap portions 102 and 103.

Figure 11:
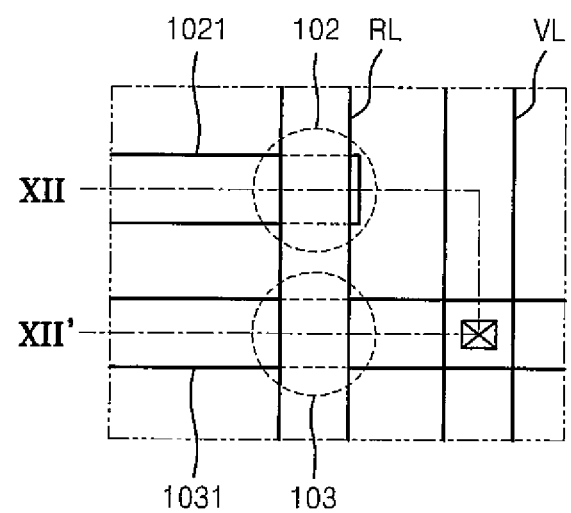
FIG. 11 is a plan view illustrating parts of the lines around the pixel of FIG. 10, according to an embodiment of the present invention.
Figure 12:
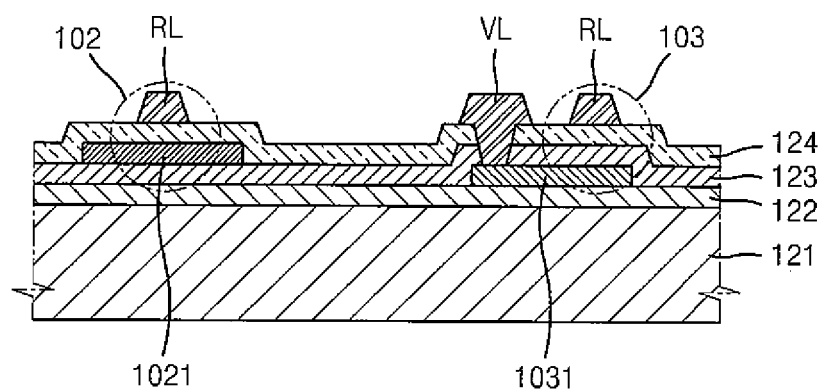
FIG. 12 is a cross-sectional view taken along the line XII-XII' of FIG. 11, according to an embodiment of the present invention.
Figure 13:
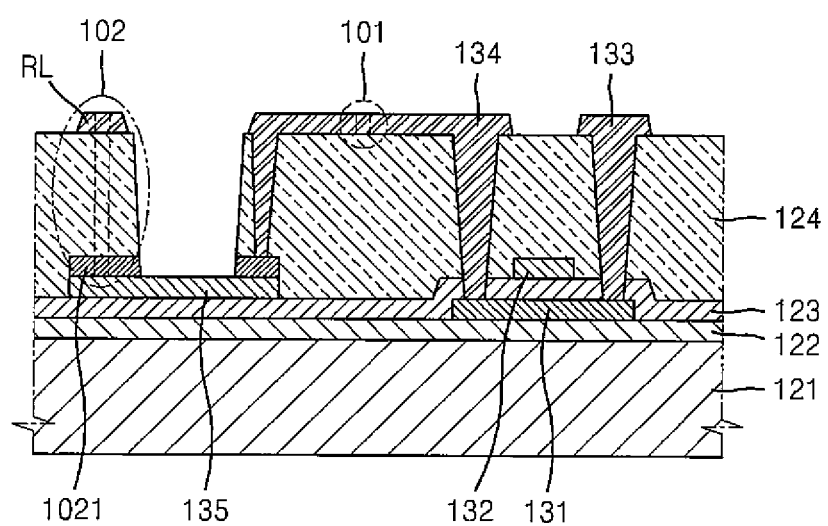
FIG. 13 is a cross-sectional view illustrating a part of the pixel of FIG. 10, according to an embodiment of the present invention.

FIG. 11 is a plan view illustrating parts of the lines around the pixel P of FIG. 10, according to an embodiment of the present invention. For example, FIG. 11 is a plan view illustrating the overlap portions 102 and 103 and parts of the connection members 1021 and 1031, the repair line RL, and the voltage line VL of FIG. 10. FIG. 12 is a cross-sectional view taken along line XII-XII' of FIG. 11, according to an embodiment of the present invention. FIG. 13 is a cross-sectional view illustrating a part of the pixel P of FIG. 10, according to an embodiment of the present invention. For example, FIG. 13 is a cross-sectional view illustrating the light-emitting element E and a driving transistor of the pixel circuit PC, according to an embodiment of the present invention.

Referring to FIG. 12, the power connection member 1031 is formed on a substrate 121 and a buffer layer 122. A first insulating film 123 is formed on the power connection member 1031, and the current connection member 1021 is formed on the first insulating film 123.

Referring to FIGS. 11 through 13, the current connection member 1021 may be formed of the same material and on the same layer as one conductive electrode, for example, a gate electrode 132, which is included in a TFT of the pixel circuit PC. A second insulating film 124 is formed on the current connection member 1021, and the repair line RL is formed on the second insulating film 124 to overlap at least a part of the current connection member 1021 in the overlap portion 102 and to be connectable to the current connection member 1021.

The power connection member 1031 may be formed of the same material and on the same layer as an active layer 131 that is included in the TFT of the pixel circuit PC. The power connection member 1031 may be formed of, for example, amorphous silicon, crystalline silicon, or oxide semiconductor. The first insulating film 123 and the second insulating film 124 are formed on the power connection member 1031, and the voltage line VL that is coupled to the power connection member 1031 through a contact hole is formed on the second insulating film 124. The repair line RL is formed on the second insulating film 124 to overlap with at least a part of the power connection member 1031 in the overlap portion 103 and to be connectable to the power connection member 1031.

For example, when the repair line RL is used to repair the pixel P of FIG. 10, the repair line RL may supply a driving current that is output from a dummy pixel to the light-emitting element E of the pixel P. To this end, the cutting portion 101 between the pixel circuit PC and the light-emitting element E is separated. An insulating film that is interposed in the overlap portion 102 may break down. Once the insulating film of the overlap portion 102 breaks down, the repair line RL may be coupled to the light-emitting element E through the current connection member 1021 and may supply driving current.

Alternatively, the repair line RL may be used to repair another defective pixel, and to this end, when the repair line RL is used to apply a power voltage to a dummy pixel that is used to repair the defective pixel from the pixel P of FIG. 10, the repair line RL may apply to the dummy pixel a power voltage that is applied to the power node of the pixel circuit PC. To this end, an insulating film that is arranged between two conductive members in the overlap portion 103 may break down. Once the insulating film of the overlap portion 103 breaks down, the repair line RL may be electrically coupled to the voltage line VL through the power connection member 1031, and may transfer the driving current to the dummy pixel that is coupled to the repair line RL.

Figure 14:
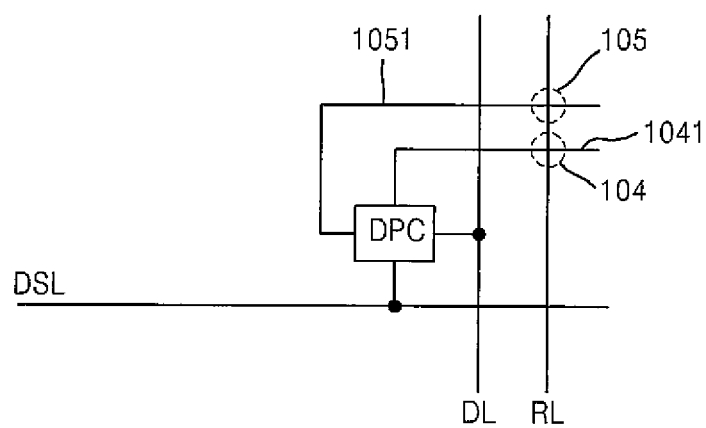
FIG. 14 is a diagram illustrating a dummy pixel and lines around the dummy pixel, according to an embodiment of the present invention.

FIG. 14 is a diagram illustrating the dummy pixel DP and lines around the dummy pixel DP, according to an embodiment of the present invention.

Referring to FIG. 14, the dummy pixel DP that is coupled to a dummy scan line DSL and the data line DL includes the dummy pixel circuit DPC. The dummy pixel DP may further include a circuit corresponding to the light-emitting element E as a circuit element as described above. A power connection member 1041 that is coupled to the output node of the dummy pixel circuit DPC overlaps the repair line RL in an overlap portion 104, and is connectable to the repair line RL. A current connection member 1051 that is coupled to the power node of the dummy pixel circuit DPC overlaps with the repair line RL in an overlap portion 105, and is connectable to the repair line RL. Although both the power connection member 1041 and the current connection member 1051 are connectable to the repair line RL in FIG. 14, the power connection member 1041 and the current connection member 1051 of the dummy pixel circuit DPC may be respectively connectable to different repair lines RL in the above embodiments of the present invention. Alternatively, the power connection member 1041 and the current connection member 1051 of the dummy pixel circuit DPC may be configured to be coupled to two different repair lines RL. Accordingly, the present embodiment is not limited to FIG. 14.

Figure 15:
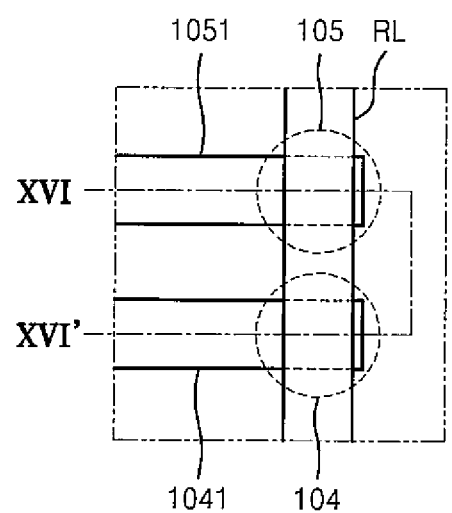
FIG. 15 is a plan view illustrating parts of the lines around the dummy pixel of FIG. 14, according to an embodiment of the present invention.
Figure 16:
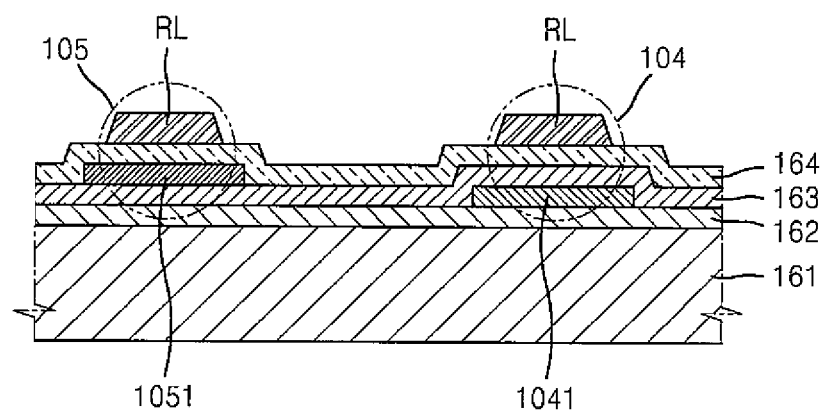
FIG. 16 is a cross-sectional view taken along the line XVI-XVI' of FIG. 14, according to an embodiment of the present invention.
Figure 17:
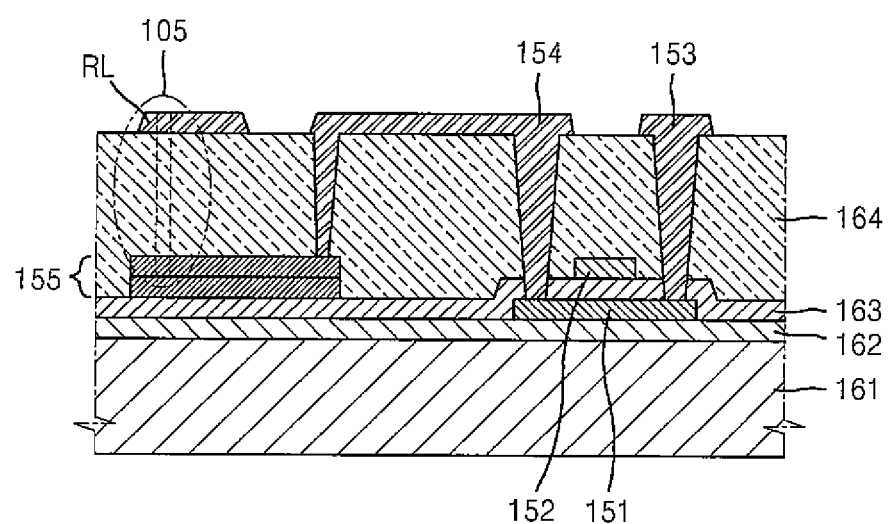
FIG. 17 is a cross-sectional view illustrating a part of the dummy pixel of FIG. 14, according to an embodiment of the present invention.

FIG. 15 is a plan view illustrating parts of the lines around the dummy pixel DP of FIG. 14, according to an embodiment of the present invention. For example, FIG. 15 is a plan view illustrating the overlap portions 104 and 105 and parts of the power and current connection members 1041 and 1051 and the repair line RL. FIG. 16 is a cross-sectional view taken along line XVI-XVI' of FIG. 14, according to an embodiment of the present invention. FIG. 17 is a cross-sectional view illustrating a part of the dummy pixel DP of FIG. 14, according to an embodiment of the present invention. For example, FIG. 17 is a cross-sectional view illustrating a driving transistor of the dummy pixel circuit DPC of FIG. 14 and the overlap portion 105 of FIG. 14, according to an embodiment of the present invention.

Referring to FIG. 16, the power connection member 1041 is formed on a substrate 161 and a buffer layer 162. A first insulating film 163 is formed on the power connection member 1041, and the current connection member 1051 is formed on the first insulating film 163.

Referring to FIGS. 15 through 17, the power connection member 1041 may be formed of the same material and on the same layer as an active layer 151 that is included in a TFT of the dummy pixel circuit DPC. The power connection member 1041 may be formed of, for example, amorphous silicon, crystalline silicon, or oxide semiconductor. A first insulating film 163 and a second insulating film 164 are formed on the power connection member 1041, and the repair line RL is formed on the second insulating film 164 to overlap at least a part of the power connection member 1041 in the overlap portion 104 and to be connectable to the power connection member 1041. An electrode 153 in FIG. 17 may be electrically coupled to the power connection member 1051 of FIG. 14 and may apply a power voltage to the driving transistor.

The current connection member 1051 may be formed of the same material and on the same layer as one conductive electrode, for example, a gate electrode 152, which is included in the TFT of the dummy pixel circuit DPC. The second insulating film 164 is formed on the current connection member 1051, and the repair line RL is formed on the second insulating film 164 to overlap at least a part of the current connection member 1051 in the overlap portion 105 and to be connectable to the current connection member 1051.

For example, when the repair line RL transfers a driving current to a defective pixel from the dummy pixel DP of FIG. 14, an insulating film that is interposed in the overlap portion 104 may break down. Once the insulating film of the overlap portion 104 breaks down, the output node of the dummy pixel circuit DPC and the repair line RL may be coupled to each other through the current connection member 1041, and a driving current that is output from the output node of the dummy pixel circuit DPC may flow to the repair line RL through the current connection member 1041.

Alternatively, when the repair line RL applies the power voltage ELVDD to the dummy pixel circuit DPC of FIG. 14, an insulating film that is interposed in the overlap portion 105 may break down. Once the insulating film of the overlap portion 105 breaks down, the power node of the dummy pixel circuit DPC and the repair line RL may be coupled to each other through the power connection member 1051, and the power voltage ELVDD may be applied to the power node of the dummy pixel circuit DPC from the repair line RL.

According to one or more embodiments of the present invention, a defective pixel may be repaired by using a dummy pixel so that the defective pixels may operate normally. According to the one or more embodiments of the present invention, a luminance difference between the defective pixel that has been repaired and a pixel that is adjacent to the defective pixel and which is caused by an IR-drop of a power voltage line may be reduced or minimized. The effects of the one or more embodiments of the present invention may be achieved by using one repair line per pixel column. That is, the one or more embodiments of the present invention may be implemented without using a plurality of repair lines per pixel column. Accordingly, an aperture ratio of a display panel may be increased and parasitic capacitance may be reduced by minimizing the number of lines in the display panel.

According to an organic light-emitting display apparatus and a method of repairing the same of the one or more of the one or more embodiments of the present invention, a defective pixel may be repaired by using a dummy pixel.

According to an organic light-emitting display apparatus and a method of the same of the one or more of the one or more embodiments of the present invention, a luminance difference between a defective pixel that has been repaired and a pixel that is adjacent to the defective pixel and which is caused by an IR-drop of a power voltage line may be reduced or minimized.

While one or more embodiments of the present invention have been described with reference to the figures, it will be understood by those of ordinary skill in the art that various changes in form and details may be made therein without departing from the spirit and scope of the present invention as defined by the following claims. Accordingly, the true technical scope of the present invention is defined by the technical spirit of the appended claims, and their equivalents.

What is claimed is:

1. An organic light-emitting display apparatus comprising:
    a plurality of dummy pixels, each comprising a dummy pixel circuit;
    a plurality of pixels comprising
        a first pixel comprising:
            a light-emitting element configured to emit light in response to a driving current supplied from the dummy pixel circuit; and
            a pixel circuit separated from the light-emitting element;
    a plurality of voltage lines, each configured to apply a power voltage to a power node of a corresponding pixel; and
    a plurality of repair lines comprising:
        a first repair line coupling a dummy pixel circuit of one of the plurality of dummy pixels and the light-emitting element of the first pixel and configured to transfer to the light-emitting element of the first pixel the driving current supplied from the dummy pixel circuit of the one of the plurality of dummy pixels; and
        a second repair line coupling the dummy pixel circuit of the one of the plurality of dummy pixels and the power node of a second pixel and configured to apply to the dummy pixel circuit of the one of the plurality of dummy pixels the power voltage that is applied to the power node of the second pixel.

2. The organic light-emitting display apparatus of claim 1, wherein the second pixel is adjacent the first pixel.

3. The organic light-emitting display apparatus of claim 1, wherein the plurality of pixels comprising the first pixel and the second pixel are arranged in a row direction and a column direction,
    at least one of the repair lines and at least one of the dummy pixels are arranged in each column,
    the first pixel is located in a first column and the second pixel is located in a second column different from the first column,
    the first repair line corresponds to the first column, and the second repair line corresponds to the second column, and
    the dummy pixel circuit configured to supply the driving current to the light-emitting element of the first pixel corresponds to the first column or the second column.

4. The organic light-emitting display apparatus of claim 1, further comprising an auxiliary repair line electrically coupling the dummy pixel circuit and the second repair line.

5. The organic light-emitting display apparatus of claim 4, wherein the auxiliary repair line couples at least two repair lines from among the plurality of repair lines.

6. The organic light-emitting display apparatus of claim 5, wherein the auxiliary repair line couples the first repair line and the second repair line,
    the first repair line comprises a first portion coupling the auxiliary repair line and the dummy pixel circuit of the one of the plurality of dummy pixels and a second portion coupling the dummy pixel circuit of the one of the plurality of dummy pixels and the light-emitting element of the first pixel, and
    the first portion and the second portion are electrically isolated from each other.

7. The organic light-emitting display apparatus of claim 5, wherein the auxiliary repair line comprises a first node coupled to the first repair line and a second node coupled to the second repair line, and both outer edges of a portion of the auxiliary repair line between the first node and the second node are cut.

8. The organic light-emitting display apparatus of claim 1, wherein the second pixel comprises a second pixel circuit and a second light-emitting element configured to emit light in response to a driving current supplied from the second pixel circuit.

9. A method of repairing an organic light-emitting display apparatus,
    the organic light-emitting display apparatus comprising:
        a plurality of dummy pixels each comprising a dummy pixel circuit;
        a plurality of pixels each comprising a light-emitting element and a pixel circuit; and
        a plurality of repair lines each coupling at least one of the plurality of pixels and at least one of the plurality of dummy pixels,
    the method comprising:
        electrically isolating the light-emitting element and the pixel circuit in a first pixel in which a defect occurs;
        electrically coupling the light-emitting element of the first pixel and a first dummy pixel circuit of a first dummy pixel of the plurality of dummy pixels to a first repair line of the plurality of repair lines to supply a driving current from the first dummy pixel circuit to the light-emitting element of the first pixel; and
        electrically coupling a power node of a pixel circuit of a second pixel and the first dummy pixel circuit to a second repair line of the plurality of repair lines to apply a power voltage of the second pixel to the first dummy pixel circuit.

10. The method of claim 9, wherein the plurality of pixels are arranged in row directions and column directions,
    at least one of the repair lines and at least one of the dummy pixels are arranged in each column, and
    the first repair line and the second repair line are arranged in different columns.

11. The method of claim 9, wherein the electrically coupling of the power node comprises:
    coupling the power node of the pixel circuit of the second pixel to the second repair line;
    coupling an output node of the first dummy pixel circuit to the first repair line;
    coupling the first repair line and the second repair line by using an auxiliary repair line; and electrically isolating a portion between a first point of the first repair line to which the output node of the first dummy pixel circuit is coupled and a second point of the first repair line to which a power node of the first dummy pixel circuit is coupled.

12. The method of claim 11, wherein the auxiliary repair line comprises a first node coupled to the first repair line and a second node coupled to the second repair line, and the method further comprises cutting both outer edges of a portion between the first node and the second node.

13. The method of claim 9, wherein the electrically coupling of the light-emitting element comprises coupling the light-emitting element of the first pixel and the first repair line in an overlapping region between the light-emitting element of the first pixel and the first repair line, and coupling the first dummy pixel circuit and the first repair line in an overlapping region between the first dummy pixel circuit and the first repair line, and the electrically coupling of the power node comprises coupling the power node of the pixel circuit of the second pixel and the second repair line in an overlapping region between the power node of the pixel circuit of the second pixel and the second repair line and coupling the first dummy pixel circuit and the second repair line in an overlapping region between the first dummy pixel circuit and the second repair line.

14. The method of claim 13, wherein the electrically coupling of the light-emitting element comprises causing a first insulating portion between the light-emitting element of the first pixel and the first repair line and a second insulating portion between the first dummy pixel circuit and the first repair line to break down, and the electrically coupling of the power node comprises causing a third insulating portion between the power node of the pixel circuit of the second pixel and the second repair line and a fourth insulating portion between the first dummy pixel circuit and the second repair line to break down.

15. An organic light-emitting display apparatus comprising:
   a plurality of dummy pixels, each of the dummy pixels comprising a dummy pixel circuit;
   a plurality of pixels, each of the plurality of pixels comprising a light-emitting element and a pixel circuit; and
   a plurality of repair lines, each configured to couple a corresponding one of the dummy pixels and a corresponding one of the pixels,
   wherein each pixel comprises a first connection portion that enables one electrode of the light-emitting element to be connectable to a repair line of the plurality of repair lines and a second connection portion that enables a power node of the pixel circuit to be connectable to the repair line.

16. The organic light-emitting display apparatus of claim 15, wherein each of the plurality of dummy pixels comprises a third connection portion that enables an output node of a corresponding dummy pixel circuit to be connectable to the repair line and a fourth connection portion that enables a power node of the corresponding dummy pixel circuit to be connectable to the repair line.

17. The organic light-emitting display apparatus of claim 15, wherein the plurality of the pixels are arranged in a row direction and a column direction,
   each of a plurality of the repair lines and a plurality of the dummy pixels are arranged in one column or one row, and
   each of the plurality of dummy pixels comprises a third connection portion that enables an output node of a corresponding dummy pixel circuit to be connectable to at least one selected from the plurality of repair lines and a fourth connection portion that enables a power node of the corresponding dummy pixel circuit to be connectable to at least one selected from the plurality of repair lines.

18. The organic light-emitting display apparatus of claim 17, wherein at least one selected from the third connection portion and the fourth connection portion is configured to be connectable to at least one selected from a first repair line of the plurality of repair lines that is provided to correspond to a column of the corresponding dummy pixel and a second repair line of the plurality of repair lines that is arranged to correspond to a column adjacent to the column of the corresponding dummy pixel.

19. The organic light-emitting display apparatus of claim 15, wherein the first connection portion comprises an overlapping region between one electrode of the light-emitting element and the repair line with a first insulating portion therebetween and an overlapping region between the power node of the pixel circuit and the repair line with a second insulating portion therebetween.

20. The organic light-emitting display apparatus of claim 15, further comprising an auxiliary repair line coupling at least two repair lines from among a plurality of the repair lines.

21. The organic light-emitting display apparatus of claim 15, wherein each of the repair lines is arranged in each pixel column or each pixel row,
   the plurality of the pixels comprise a first pixel and a second pixel, and
   the plurality of repair lines comprise a first repair line that is arranged in a first column comprising the first pixel and a second repair line that is arranged in a second column comprising the second pixel,
   and the first pixel comprises a first connection portion that enables one electrode of the light-emitting element to be connectable to at least one of the first repair line and second repair line, and a second connection portion that enables a power node of the pixel circuit to be connectable to at least one of the first repair line and the second repair line.

* * * * *